US010523201B2

(12) United States Patent
Weber et al.

(10) Patent No.: US 10,523,201 B2
(45) Date of Patent: Dec. 31, 2019

(54) PANE ARRANGEMENT WITH PANE WITH LOW-E COATING AND CAPACITIVE SWITCHING REGION

(71) Applicant: SAINT-GOBAIN GLASS FRANCE, Courbevoie (FR)

(72) Inventors: Patrick Weber, Alsdorf (DE); Stefan Droste, Herzogenrath (DE); Klaus Schmalbuch, Goult (FR); Pascal Bauerle, Davenescourt (FR)

(73) Assignee: SAINT-GOBAIN GLASS FRANCE, Courbevoie (FR)

( * ) Notice: Subject to any disclaimer, the term of this patent is extended or adjusted under 35 U.S.C. 154(b) by 0 days.

(21) Appl. No.: 15/739,691

(22) PCT Filed: Aug. 18, 2016

(86) PCT No.: PCT/EP2016/069660
§ 371 (c)(1),
(2) Date: Dec. 22, 2017

(87) PCT Pub. No.: WO2017/029384
PCT Pub. Date: Feb. 23, 2017

(65) Prior Publication Data
US 2018/0175857 A1 Jun. 21, 2018

(30) Foreign Application Priority Data
Aug. 18, 2015 (EP) ..................... 15181324

(51) Int. Cl.
*B32B 17/10* (2006.01)
*H03K 17/96* (2006.01)
(Continued)

(52) U.S. Cl.
CPC ..... *H03K 17/962* (2013.01); *B32B 17/10036* (2013.01); *B32B 17/10183* (2013.01);
(Continued)

(58) Field of Classification Search
CPC ........ B32B 17/10036; B32B 17/10183; B32B 17/10211; B32B 2225/20;
(Continued)

(56) References Cited

U.S. PATENT DOCUMENTS 6,452,514 B1    9/2002  Philipp
9,050,779 B2*   6/2015  Derda ................. B32B 17/10
(Continued)

FOREIGN PATENT DOCUMENTS

DE    202006006192 U1   7/2006
EP        0899882 A1    3/1999
(Continued)

OTHER PUBLICATIONS

International Search Report for International Application No. PCT/EP2016/069660 filed Aug. 18, 2016 on behalf of Saint-Gobain Glass France, dated Nov. 7, 2016. 5 pages. (German + English Translation).

(Continued)

*Primary Examiner* — Stephen W Smoot
(74) *Attorney, Agent, or Firm* — Steinfl + Bruno LLP

(57) ABSTRACT

A pane arrangement having a pane with an inner surface and an outer surface, a low-E coating arranged on the inner surface of the pane. The pane arrangement having a coating-free first partition line formed in the low-E coating. A capacitive switching region is electrically isolated from a surrounding region of the low-E coating. The surrounding region surrounds the capacitive switching region in sections. The capacitive switching region has a contact region, a supply line region and a first connection region. The supply line region electrically connects the contact region to the first connection region. A coating-free second partition line is formed in the low-E coating. The surrounding region is electrically isolated from an outer region of the low-E (Continued)

Figure 1A:
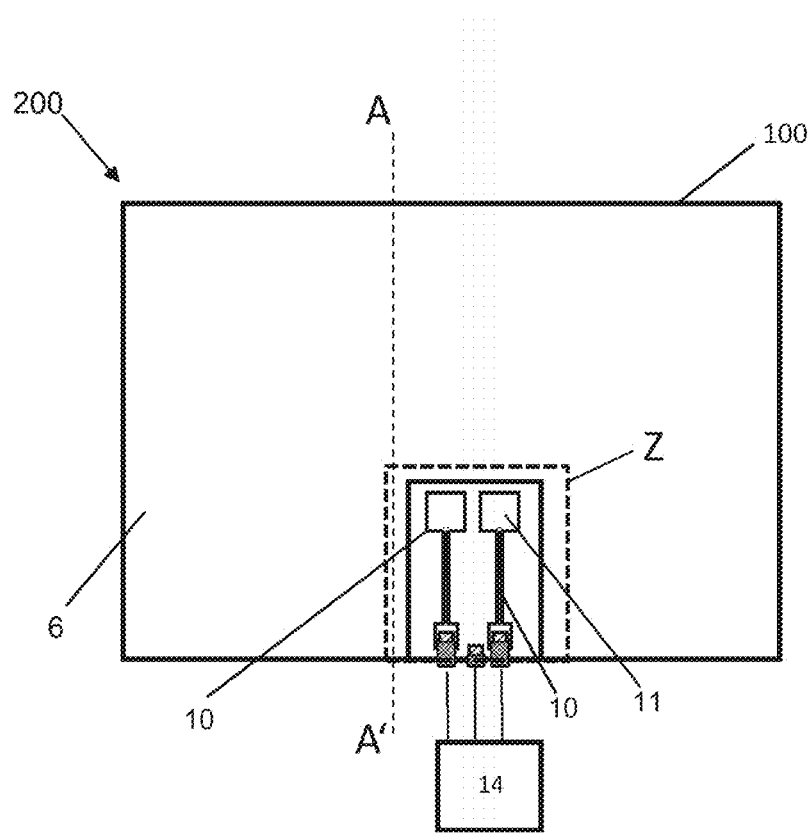

coating. The outer region surrounds the surrounding region. A capacitive sensor electronics system is electrically connected to the first connection region of the capacitive switching region and to the surrounding region by a second connection region.

20 Claims, 13 Drawing Sheets

(51) Int. Cl.
  *E06B 9/24* (2006.01)
  *B60J 3/00* (2006.01)
  *G02F 1/15* (2019.01)
  *G02F 1/17* (2019.01)

(52) U.S. Cl.
  CPC .. *B32B 17/10211* (2013.01); *B32B 17/10293* (2013.01); *B32B 17/10761* (2013.01); *E06B 9/24* (2013.01); *B32B 2255/20* (2013.01); *B32B 2307/202* (2013.01); *B32B 2307/412* (2013.01); *B32B 2315/08* (2013.01); *B32B 2329/06* (2013.01); *B32B 2419/00* (2013.01); *B32B 2457/208* (2013.01); *B32B 2605/08* (2013.01); *B60J 3/007* (2013.01); *E06B 2009/2417* (2013.01); *G02F 1/15* (2013.01); *G02F 1/172* (2013.01); *H03K 2217/96015* (2013.01); *H03K 2217/960755* (2013.01); *H03K 2217/960765* (2013.01)

(58) Field of Classification Search
  CPC ........ B32B 2307/202; B32B 2307/412; B32B 2315/08; B32B 2457/208; B32B 2605/08; B60J 3/007; E06B 9/24; E06B 2009/2417; G02F 1/15; G02F 1/172; G02F 1/19; H03K 17/962; H03K 2217/960755; H03K 2217/960765
  See application file for complete search history.

(56) References Cited

U.S. PATENT DOCUMENTS

| | | |
|---|---|---|
| 2002/0192473 A1 | 12/2002 | Gentilhomme et al. |
| 2009/0039901 A1* | 2/2009 | Delatte ............... B32B 17/10 324/664 |
| 2010/0165436 A1* | 7/2010 | Voss ................ B32B 17/10 359/238 |
| 2010/0179725 A1 | 7/2010 | Boote et al. |
| 2011/0027554 A1 | 2/2011 | Gouardes et al. |
| 2011/0139756 A1 | 6/2011 | Raible et al. |
| 2011/0146172 A1 | 6/2011 | Mauvernay et al. |
| 2013/0186875 A1 | 7/2013 | Lisinski et al. |
| 2015/0146286 A1 | 5/2015 | Hagen et al. |
| 2015/0227229 A1 | 8/2015 | Schwartz et al. |
| 2015/0301367 A1 | 10/2015 | Mennig |
| 2016/0002099 A1 | 1/2016 | Manz et al. |
| 2016/0002100 A1 | 1/2016 | Melcher et al. |
| 2016/0325529 A1* | 11/2016 | Linthout ........... B32B 17/10036 |
| 2018/0009198 A1* | 1/2018 | Weber ............... B32B 17/10036 |
| 2018/0175857 A1 | 6/2018 | Weber et al. |
| 2018/0227229 A1 | 8/2018 | Lopez |

FOREIGN PATENT DOCUMENTS

| | | |
|---|---|---|
| EP | 1515211 A1 | 3/2005 |
| EP | 1218307 B1 | 7/2008 |
| EP | 2139049 A1 | 12/2009 |
| EP | 2200097 A1 | 6/2010 |
| EP | 2247549 A2 | 11/2010 |
| RU | 2507563 C1 | 2/2014 |
| WO | 2009/112759 A2 | 9/2009 |
| WO | 2011/036010 A1 | 3/2011 |
| WO | 2012/004279 A1 | 1/2012 |
| WO | 2013/053611 A1 | 4/2013 |
| WO | 2013131667 A1 | 9/2013 |
| WO | 2014/086555 A1 | 6/2014 |
| WO | 2014127867 A1 | 8/2014 |
| WO | 2014127868 A1 | 8/2014 |
| WO | 2014135467 A1 | 9/2014 |
| WO | 2017/029384 A1 | 2/2017 |

OTHER PUBLICATIONS

Written Opinion for International Application No. PCT/EP2016/069660 filed Aug. 18, 2016 on behalf of Saint-Gobain Glass France, dated Nov. 7, 2016. 13 pages. (German + English Translation).
International Preliminary Report on Patentability for International Application No. PCT/EP2016/069660 filed Aug. 18, 2016 on behalf of Saint-Gobain Glass France, dated Feb. 20, 2018. 15 pages. (German + English Translation).

* cited by examiner

A-A'

I. Applying a low-E coating (6) to an inner surface (IV) of a pane (1)

II. Introducing at least one first partition line (7) into the low-E coating (6), which electrically divides the low-E coating (6) into at least one capacitive switching region (10) and at least one surrounding region (15), preferably by laser patterning or by mechanical or chemical ablation

III. Introducing at least one second partition line (8) into the low-E coating (6), which electrically divides the surrounding region (15) and an outer region (31), preferably by laser patterning or by mechanical or chemical ablation

Fig. 4A

PANE ARRANGEMENT WITH PANE WITH LOW-E COATING AND CAPACITIVE SWITCHING REGION

CROSS REFERENCE TO RELATED APPLICATIONS

The present application is the U.S. national stage of International Patent Application PCT/EP2016/069660 filed internationally on Aug. 18, 2016, which, in turn, claims priority to European Patent Application No. 15181324.3 filed on Aug. 18, 2015.

The invention relates to a pane arrangement with a pane with a low-E coating and a capacitive switching region, as well as a method for production thereof.

The interior of a motor vehicle or of a building can heat up greatly in the summer with high ambient temperatures and intense direct sunlight. When, for example, the outside temperature is lower than the temperature in the vehicle interior, which occurs in particular in the winter, a cold vehicle pane acts as a heat sink, which is perceived as unpleasant by the occupants. High heating performance of the climate control system must also be provided to prevent excessive cooling of the interior via the vehicle panes.

Thermal radiation reflecting coatings, so-called "low-E coatings", are known, for example, from WO 2013/131667 A1, US 20110146172 A2, EP 1 218 307 B1, EP 2 247 549 A2, WO 2014/127867 A1, and WO 2014/127868 A1. Such a low-E coating reflects a significant part of sunlight, in particular in the infrared range, which, in the summer, results in reduced warming of the vehicle interior. Moreover, the coating reduces the emission of long-wave thermal radiation of a heated pane into the vehicle interior when the coating is applied on the surface of a pane facing the vehicle interior. Moreover, in the case of low outside temperatures in the winter, such a low-E coating reduces the outward emission of heat from the interior into the external surroundings.

Furthermore, it is known that switching regions can be formed by a surface electrode or by an arrangement of two coupled electrodes, for example, as capacitive switching regions. When an object approaches the switching region, the capacitance of the surface electrode against ground or the capacitance of the capacitor formed by the two coupled electrodes changes. The capacitance change is measured by a circuit arrangement or sensor electronics system and when a threshold value is exceeded, a switching signal is triggered. Circuit arrangements for capacitive switches are known, for example, from DE 20 2006 006 192 U1, EP 0 899 882 A1, U.S. Pat. No. 6,452,514 B1, and EP 1 515 211 A1. From US 2010/0179725 A1, for example, a composite glazing with an internal, laminated-in capacitive sensor is known.

International patent applications WO 2013/053611 A1 and WO 2014/135467 A1 present, in each case, a low-E coating with a capacitive switch.

The object of the present invention consists in providing an improved pane arrangement that has a capacitive switching region that can be simply and economically integrated into the window pane. A contact sensor or a proximity sensor can be formed in a simple manner with the capacitive switching region. In addition, the signal quality should be improved relative to prior art switching regions.

These and other objects of the present invention are accomplished according to the invention by a pane arrangement according to the disclosure. Preferred embodiments emerge from the disclosure.

The pane arrangement according to the invention with a capacitive switching region comprises at least:

A pane that has an inner surface (IV) and an outer surface (III).

A low-E coating that is arranged at least partially on the inner surface (IV) of the pane.

At least one coating-free first partition line, which is formed in the low-E coating and by which at least one capacitive switching region formed by the low-E coating, is electrically isolated from a surrounding region formed by the low-E coating. The surrounding region surrounds the capacitive switching region at least in sections, in particular completely. If the capacitive switching region extends all the way to the edge of the low-E coating, the surrounding region surrounds the capacitive switching region only in sections or partially. In this case, the first partition line is not closed and extends free ending all the way to the edge of the low-E coating. It is, however, also possible for the capacitive switching region to be situated completely within the low-E coating such that the surrounding region completely surrounds the capacitive switching region. In this case, the first partition line is closed. The capacitive switching region has a contact region, a supply line region, and a first connection region, with the supply line region electrically connecting the contact region to the first connection region.

At least one coating-free second partition line, which is formed in the low-E coating and by which the surrounding region is electrically isolated from an outer region formed by the low-E coating. The outer region surrounds the surrounding region at least partially, in particular completely. If the surrounding region extends all the way to the edge of the low-E coating, the outer region surrounds the surrounding region only in sections or partially. In this case, the second partition line is not closed and extends free ending all the way to the edge of the low-E coating. It is, however, also possible for the surrounding region not to extend all the way to the edge of the low-E coating such that the outer region completely surrounds the surrounding region. In this case, the second partition line is closed.

A capacitive sensor electronics system, which is electrically connected to the first connection region of the capacitive switching region and to the surrounding region via a second connection region.

As the inventors were able to demonstrate, by forming a surrounding region that is smaller than the region of the low-E coating outside the capacitive switching region (i.e., complete low-E coating except for the capacitive switching region), an increase in the signal/noise ratio and thus an improvement of the switching behavior of the capacitive switching region can advantageously be achieved.

The pane or window pane of the pane arrangement according to the invention is suitable for separating an interior space from an external environment. The window pane can be used in many ways: In the case of a window pane as a vehicle window, it can, for example, be a roof panel, a windshield, a rear window, a side window, or another glazing delimiting the vehicle interior. Here, "outer surface of the pane" means the surface of the pane that faces outward, i.e., away from the vehicle interior. Accordingly, "inner surface" means the surface of the pane that faces the vehicle interior.

In the case of a window pane as an architectural pane or as structural glazing, the window pane can, for example, be a façade glazing, a roof panel, or another glazing delimiting a living area or a building interior. Here, "outer surface of the pane" means the surface of the pane that faces outward, i.e., away from the interior. Accordingly, "inner surface" means the surface of the pane that faces the interior.

In general, the inner surface is defined by the fact that the low-E coating is arranged thereon. The outer surface is, then, the surface of the pane opposite the inner surface.

A low-E coating according to the invention includes at least one functional layer and, optionally, in each case, one or a plurality of adhesive layers, barrier layers, and/or antireflection layers. The low-E coating is preferably a layer system consisting of, in each case, at least one adhesive layer, one functional layer, one barrier layer, one antireflection layer, and another barrier layer. Particularly suitable low-E coatings include a functional layer consisting of at least one electrically conductive oxide (TCO), preferably indium tin oxide (ITO), fluorine-doped tin oxide ($SnO_2$:F), antimony-doped tin oxide ($SnO_2$:Sb), aluminum-doped zinc oxide (ZnO:Al), and/or gallium-doped zinc oxide (ZnO:Ga).

Particularly advantageous low-E coatings according to the invention have an interior-side emissivity of the window pane according to the invention less than or equal to 60%, preferably less than or equal to 45%, particularly preferably less than or equal to 30%, and in particular less than or equal to 20%. Here, the term "interior-side emissivity" refers to the measurement that indicates how much thermal radiation the pane gives off in the installed position compared to an ideal thermal radiator (a black body) in an interior, for example, of a building or of a vehicle. In the context of the invention, "emissivity" means the total normal emissivity at 283 K pursuant to the standard EN 12898.

In an advantageous embodiment, the sheet resistance of the low-E coating according to the invention is from 10 ohm/square to 200 ohm/square and preferably from 10 ohm/square to 100 ohm/square, particularly preferably from 15 ohm/square to 50 ohm/square, and in particular from 20 ohm/square to 35 ohm/square.

The absorption of the low-E coating according to the invention in the visible spectral range is preferably approx. 1% to approx. 15%, particularly preferably approx. 1% to approx. 7%. The absorption of the coating can be determined by measuring the absorption of a coated pane and subtracting the absorption of the uncoated pane. The pane according to the invention has, in reflection, a color value a* of −15 to +5 and a color value b* of −15 to +5, observed from the side provided with the low-E coating according to the invention. The data a* and b* are based on the color coordinates of the colorimetric model (L*a*b*-color space).

An advantageous low-E coating according to the invention has, in the visible spectral range, low absorption and low reflection and, consequently, high transmittance. The low-E coating can, consequently, also be used on panes for which a significant reduction of transmittance is undesirable, for example, for window panes in buildings, or legally forbidden, for example, for windshields or front side panes in motor vehicles.

The low-E coating according to the invention is also corrosion resistant. The low-E coating can, consequently, be applied on the surface of the pane that is intended, in the installed position of the pane, to face an interior, for example, of a vehicle or a building. On this surface, the low-E coating particularly effectively reduces the emission of thermal radiation from the pane into the interior in the summer and the outward emission of heat into the external environment in the winter.

Such low-E coatings are particularly suited, in the case of roof glazings, to offer the vehicle owner enough thermal comfort that the use and even the installation of a roll-up sunshade can be dispensed with.

In order to achieve the indicated preferred values for emissivity, sheet resistance, absorption, and color value in reflexion, the pane can be subjected to heat treatment after application of the thermal-radiation reflective coating. The pane is preferably heated to a temperature of at least 200° C., particularly preferably at least 300° C. Such heat treatment influences, in particular, the crystallinity of the functional layer and results in improved transmittance of the coating according to the invention. The heat treatment also reduces the sheet resistance of the coating, resulting in reduced emissivity.

It has been found that, due to the diffusion of oxygen, the heat treatment results in oxidation of the functional layer. The extent of oxidation of the functional layer can be influenced by the barrier layer. The range for the thickness of the barrier layer from 10 nm to 40 nm is particularly advantageous in terms of the transmittance of visible light, sheet resistance, and, in particular, the flexibility of the low-E coating. A thinner barrier layer can result in an excessively high oxygen content of the functional layer after the heat treatment. A thicker barrier layer can result in an excessively low oxygen content of the functional layer after the heat treatment. The thickness of the barrier layer is preferably from 10 nm to 30 nm, particularly preferably 12 nm to 30 nm, most particularly preferably from 15 nm to 25 nm, and, in particular, from 18 nm to 22 nm. Thus, particularly good results are achieved in terms of the transmittance of visible light, sheet resistance, and flexibility. However, the thickness of the barrier layer can, for example, also be from 10 nm to 18 nm or from 12 nm to 18 nm.

The barrier layer also influences the corrosion resistance of the coating according to the invention. A thinner barrier layer results in greater susceptibility of the coating to corrosion from a humid atmosphere. The corrosion of the coating results, in particular, in a significant increase in the absorption of visible light by the coating.

The barrier layer additionally influences the optical properties of the thermal-radiation-reflecting coating, in particular, the color impression in reflection of light. The barrier layer is, according to the invention, dielectric. The refractive index of the material of the barrier layer is preferably greater than or equal to the refractive index of the material of the functional layer. The refractive index of the material of the barrier layer is particularly preferably from 1.7 to 2.3. The values indicated for refractive indices are measured at a wavelength of 550 nm.

The barrier layer preferably includes at least an oxide and/or a nitride. The oxide and/or nitride can have stoichiometric or non-stoichiometric composition. The barrier layer particularly preferably includes at least silicon nitride ($Si_3N_4$). This is particularly advantageous in terms of the effect of the barrier layer on the oxidation of the functional layer and on the optical properties of the pane. The silicon nitride can have dopants, for example, titanium, zirconium, boron, hafnium, and/or aluminum. The silicon nitride is most particularly preferably doped with aluminum ($Si_3N_4$:Al) or doped with zirconium ($Si_3N_4$:Zr) or doped with boron ($Si_3N_4$:B). This is particularly advantageous in terms of the optical properties, flexibility, smoothness, and emissivity of the coating as well as the speed of application of the barrier layer, for example, by cathodic sputtering.

The silicon nitride is preferably deposited by magnetically enhanced cathodic sputtering with a target that contains at least silicon. The target for deposition of a barrier layer containing aluminum-doped silicon nitride preferably contains from 80 wt.-% to 95 wt.-% silicon and from 5 wt.-% to 20 wt.-% aluminum as well as production-related admixtures. The target for deposition of a barrier layer containing boron-doped silicon nitride preferably contains from 99.9990 wt.-% to 99.9999 wt.-% silicon and from 0.0001 wt.-% to 0.001 wt.-% boron as well as production-related admixtures. The target for deposition of a barrier layer containing zirconium-doped silicon nitride preferably contains from 60 wt.-% to 90 wt.-% silicon and from 10 wt.-% to 40 wt.-% zirconium as well as production-related admixtures. The deposition of the silicon nitride is preferably done with addition of nitrogen as a reaction gas during the cathodic sputtering.

During heat treatment after application of the low-E coating according to the invention, the silicon nitride can be partially oxidized. A barrier layer deposited as $Si_3N_4$ contains, after heat treatment, $Si_xN_yO_z$, with the oxygen content typically from 0 atom-% to 35 atom-%.

However, alternatively, the barrier layer can also include, for example, at least $WO_3$, $Nb_2O_5$, $Bi_2O_3$, $TiO_2$, $Zr_3N_4$, and/or AlN.

The adhesive layer results in durably stable adhesion of the layers deposited above the adhesive layer on the pane. The adhesive layer further prevents the accumulation of ions diffusing out of the pane in the boundary region to the functional layer, in particular of sodium ions, if the pane is made of glass. Such ions can lead to corrosion and to low adhesion of the functional layer. The adhesive layer is, consequently, particularly advantageous in terms of the stability of the functional layer.

The material of the adhesive layer preferably has a refractive index in the range of the refractive index of the pane. The material of the adhesive layer preferably has a lower refractive index than the material of the functional layer. The adhesive layer preferably contains at least one oxide. The adhesive layer particularly preferably contains silicon dioxide ($SiO_2$). This is particularly advantageous in terms of the adhesion of the layers deposited above the adhesive layer on the pane. The silicon dioxide can have dopants, for example, fluorine, carbon, nitrogen, boron, phosphorus, and/or aluminum. The silicon dioxide is most particularly preferably doped with aluminum ($SiO_2$:Al), doped with boron ($SiO_2$:B), or doped with zirconium ($SiO_2$:Zr). This is particularly advantageous in terms of the optical properties of the coating as well as the speed of the application of the adhesive layer, for example, by cathodic sputtering.

The silicon dioxide is preferably deposited using magnetically enhanced cathodic sputtering with a target that contains at least silicon. The target for deposition of an adhesive layer containing aluminum-doped silicon dioxide preferably contains from 80 wt.-% to 95 wt.-% silicon and from 5 wt.-% to 20 wt.-% aluminum as well as production-related admixtures. The target for deposition of an adhesive layer containing boron-doped silicon dioxide preferably contains from 99.9990 wt.-% to 99.9999 wt.-% silicon and from 0.0001 wt.-% to 0.001 wt.-% boron as well as production-related admixtures. The target for deposition of an adhesive layer containing zirconium-doped silicon dioxide preferably contains from 60 wt.-% to 90 wt.-% silicon and from 10 wt.-% to 40 wt.-% zirconium as well as production-related admixtures. The deposition of the silicon dioxide is preferably done with addition of oxygen as a reaction gas during the cathodic sputtering.

The doping of the adhesive layer can also improve the smoothness of the layers applied above the adhesive layer. High smoothness of the layers is particularly beneficial with the use of the pane according to the invention in the motor vehicle sector, since an unpleasant rough feel of the panes is thus avoided. When the pane according to the invention is a side window pane, it can be moved with low friction with the sealing lips.

However, the adhesive layer can also include other materials, for example, other oxides such as $TiO_2$, $Al_2O_3$, $Ta_2O_5$, $Y_2O_3$, ZnO, and/or $ZnSnO_x$ or nitrides such an such as AlN.

The adhesive layer preferably has a thickness from 10 nm to 150 nm, particularly preferably from 15 nm to 50 nm, for example, approx. 30 nm. This is particularly advantageous in terms of the adhesion of the coating according to the invention and the prevention of the diffusion of ions of the pane into the functional layer.

An additional adhesion-promoting layer, preferably with a thickness from 2 nm to 15 nm, can also be arranged below the adhesive layer. For example, the adhesive layer can contain $SiO_2$ and the additional adhesion-promoting layer can contain at least an oxide such as $TiO_2$, $Al_2O_3$, $Ta_2O_5$, $Y_2O_3$, ZnO, and/or $ZnSnO_x$, or a nitride such as AlN. The adhesion of the coating according to the invention is advantageously further improved by the adhesion-promoting layer. Moreover, the adhesion-promoting layer enables improved adjustment of the color values and transmittance or reflexion.

The functional layer has reflective properties for thermal radiation, in particular infrared radiation, but is largely transparent in the visible spectral range. According to the invention, the functional layer includes at least one transparent, electrically conductive oxide (TCO). The refractive index of the material of the functional layer is preferably from 1.7 to 2.5. The functional layer preferably contains at least indium tin oxide (ITO). Thus, particularly good results are achieved in terms of the emissivity and the flexibility of the coating according to the invention.

The indium tin oxide is preferably deposited using magnetically enhanced cathodic sputtering with a target of indium tin oxide. The target preferably contains from 75 wt.-% to 95 wt.-% indium oxide and from 5 wt.-% to 25 wt.-% tin oxide as well as production-related admixtures. The deposition of the indium tin oxide is preferably done under a protective gas atmosphere, for example, argon. A small amount of oxygen can be added to the protective gas, for example, to improve the homogeneity of the functional layer.

Alternatively, the target can preferably contain at least from 75 wt.-% to 95 wt.-% indium and from 5 wt.-% to 25 wt.-% tin. The deposition of the indium tin oxide is preferably done with the addition of oxygen as a reaction gas during the cathodic sputtering.

The emissivity of the pane according to the invention can be influenced by the thickness of the functional layer. The thickness of the functional layer is preferably from 40 nm to 200 nm, particularly preferably from 90 nm to 150 nm, and most particularly preferably from 100 nm to 130 nm, for example, approx. 120 nm. In this range for the thickness of the functional layer, particularly advantageous values for emissivity and a particularly advantageous capability of the functional layer to withstand a mechanical transformation such as bending or tempering without damage are obtained.

The functional layer can, however, also include other transparent, electrically conductive oxides, for example, fluorine-doped tin oxide ($SnO_2$:F), antimony-doped tin oxide ($SnO_2$:Sb), indium-zinc mixed oxide (IZO), gallium-doped or aluminum-doped zinc oxide, niobium-doped titanium oxide, cadmium stannate, and/or zinc stannate.

The antireflection layer reduces reflections in the visible spectral range on the window pane according to the invention. By means of the antireflection layer, in particular high transmittance through the window pane according to the invention is obtained in the visible spectral range, as well as a neutral color impression of reflected and transmitted light. The antireflection layer also improves the corrosion resistance of the functional layer. The material of the antireflection layer preferably has a refractive index smaller than the refractive index of the material of the functional layer. The refractive index of the material of the antireflection layer is preferably less than or equal to 1.8.

The antireflection layer preferably contains at least one oxide. The antireflection layer particularly preferably includes silicon dioxide ($SiO_2$). This is particularly advantageous in terms of the optical properties of the pane and the corrosion resistance of the functional layer. The silicon dioxide can have dopants, for example, fluorine, carbon, nitrogen, boron, phosphorus, and/or aluminum. The silicon nitride is most particularly preferably doped with aluminum ($SiO_2$:Al), doped with boron ($SiO_2$:B), or doped with zirconium ($SiO_2$:Zr).

The antireflection layer can, however, also contain other materials, for example, other oxides such as $TiO_2$, $Al_2O_3$, $Ta_2O_5$, $Y_2O_3$, ZnO, and/or ZnSnO, or nitrides such as AlN.

The antireflection layer preferably has a thickness from 20 nm to 150 nm, particularly preferably from 40 nm to 100 nm. This is particularly advantageous in terms of low reflection and high transmittance of visible light as well as the adjustment of a specific color impression of the pane and the corrosion resistance of the functional layer.

In an advantageous embodiment of the invention, a masking layer is arranged above the thermal radiation reflecting coating. The masking layer protects the coating according to the invention against damage, in particular against scratching. The masking layer preferably contains at least one oxide, particularly preferably at least titanium oxide ($TiO_x$), $ZrO_2$, $HfO_2$, $Nb_2O_5$, $Ta_2O_5$, $Cr_2O_3$, $WO_3$, and/or $CeO_2$. The thickness of the masking layer is preferably from 2 nm to 50 nm, particularly preferably from 5 nm to 20 nm. Thus, particularly good results in terms of scratch-resistance are obtained.

Exemplary layer systems that are suitable as low-E coatings as well as method for production thereof are known, for example, from WO 2013/131667 A1.

In the pane or window pane of the pane arrangement according to the invention, at least one capacitive switching region is electrically isolated from the low-E coating by at least one coating-free first partition line. The first partition line is implemented in the low-E coating or formed in the low-E coating. This means that the regions separated by the first partition line are electrically isolated from one another. The regions separated by the first partition line are advantageously isolated from one another galvanically. "Galvanically isolated from one another" means that no direct-current (DC) can flow between the regions.

The capacitive switching region has a contact region, a supply line region, and a connection region, with the supply line region electrically connecting the contact region to the connection region and the connection region electrically connectable to a sensor electronics system.

In an advantageous embodiment of the invention, the ratio of the width $b_Z$ to the length $l_Z$ of the supply line region is less than or equal to 1:700 and preferably 1:3 to 1:100. In the context of the present invention, if the supply line region does not have a constant width $b_Z$, for example, if it is implemented in the shape of a trapezoid or a drop, "width $b_Z$" means the average width of the supply line region.

The length $l_Z$ of the supply line region is preferably from 1 cm to 70 cm, preferably from 1 cm to 12 cm, and in particular from 3 cm to 8 cm. The width $b_Z$ of the supply line region is preferably from 0.5 mm to 10 mm and particularly preferably from 0.5 mm to 2 mm. The shape of the supply line region is preferably rectangular, strip-shaped, or line-shaped. The supply line region can be rectilinear, but also curved, angled, L-shaped, U-shaped, or have any desire curvilinear shape. The supply line region can thus be adapted in a simple manner to the respective circumstances of the pane, such as the low-E coating-free zones and, for example, to bypass them.

In an advantageous embodiment of the switching region, the contact region has an area from 1 $cm^2$ to 200 $cm^2$, particularly preferably from 1 $cm^2$ to 9 $cm^2$. The length $l_B$ of the contact region is preferably from 1 cm to 14 cm and, particularly preferably from 1 cm to 3 cm. The maximum width $b_B$ of the contact region is preferably from 1 cm to 14 cm and particularly preferably from 1 cm to 3 cm. The contact region can, in principle, have any desired shape. Particularly suitable contact regions are circular, elliptical, or drop-shaped. Alternatively, angled shapes are possible, for example, triangles, squares, rectangles, trapezoids, or other types of quadrilaterals or higher order polygons. In general, it is particularly advantageous for any corners to be rounded. This applies to all regions of the switching region, in particular in the transitional area between the contact region and the supply line region and/or the supply line region and the connection region. It is particularly advantageous for the corners to have a radius of curvature of at least 3 mm, preferably of at least 8 mm.

In another advantageous embodiment of the switching region, the ratio of the width $b_Z$ of the supply line region to the maximum width $b_B$ of the contact region is at least 1:2 and in particular at least 1:10. Thus, it was possible to obtain particularly good switching results.

In an advantageous embodiment of the pane arrangement according to the invention, the width $t_1$ of the partition lines is from 30 µm to 200 µm and preferably from 70 µm to 140 µm. Such thin partition lines enable reliable and sufficiently high electrical insulation and, at the same time, interfere only slightly or not at all with vision through the composite pane.

The switching region is a capacitive switching region, in other words, it is specially implemented for capacitive contact detection or proximity detection. In an advantageous embodiment, the switching region forms a surface electrode. The capacitance of the surface electrode is measured by an external capacitive sensor electronics system. The capacitance of the surface electrode changes against ground when a suitable object (preferably a human body) comes into its proximity or, for example, contacts the low-E coating in the region of the surface electrode. The capacitance change is measured by the sensor electronics system and when a threshold value is exceeded, a switching signal is triggered. The switching region is defined by the shape and size of the surface electrode.

The region of the electrically conductive layer that is arranged outside the capacitive switching region is connected to the sensor electronics system via the second connection region. The surrounding region does not include the entire low-E coating outside the capacitive switching region, but, instead, is separated by at least one second partition line from the low-E coating and electrically isolated from the capacitive switching region and the part of the low-E coating surrounding the surrounding region or outer region. The second partition line surrounds the capacitive switching region at least partially, in particular completely. The second partition line, which at least partially borders the surrounding region and separates the surrounding region from the remaining surrounding low-E coating (i.e., outer region), preferably has a shortest distance of 0.1 mm to 200 cm, particularly preferably of 0.5 mm to 100 mm, and, in particular, a shortest distance of 1 mm to 11 mm from the adjacent first partition line. The shortest distance thus corresponds to the width u of the surrounding region. The surrounding region borders all capacitive switching regions at least partially (if they extend to the edge of the low-E coating) or completely (if they do not extend to the edge of the low-E coating).

In such an arrangement, the capacitive switching region and the surrounding region form two electrodes that are capacitively coupled to one another. The capacitance of the capacitor formed by the electrodes changes with the approach of a suitable object, preferably a human body part. The capacitance change is measured by a sensor electronics system and when a threshold value is exceeded, a switching signal is triggered. The sensitive region is defined by the shape and size of the region in which the electrodes are capacitively coupled. Thus, particularly good signal quality can be achieved.

The capacitive switching region and the surrounding region according to the invention are integrated into the pane or window pane according to the invention. Thus, no switch or the like is necessary as a separate component that has to be mounted on the window pane. The window pane preferably also has no other components that are arranged on its surfaces in the field of vision. This is particularly advantageous in terms of a thin design of the window pane as well as only slight disruption of the vision through the window pane.

One embodiment of the invention comprises a composite pane with a capacitive switching region and low-E coating, at least comprising:
  one inner pane, which consists of the pane of the pane arrangement according to the invention with a capacitive switching region and low-E coating,
  one outer pane with an inner surface (II), and
  at least one intermediate layer, which bonds the inner surface (II) of the outer pane are really to an outer surface (III) of the inner pane.

The inner surface of the composite pane thus corresponds to the inner surface of the inner pane and the outer surface of the composite pane corresponds to the outer surface of the outer pane.

In the case of a composite pane, the inner pane and the outer pane are bonded to one another by at least one intermediate layer. The intermediate layer is preferably transparent. The intermediate layer preferably contains at least one plastic, preferably polyvinyl butyral (PVB), ethylene vinyl acetate (EVA), and/or polyethylene terephthalate (PET). The intermediate layer can, however, also contain, for example, polyurethane (PU), polypropylene (PP), polyacrylate, polyethylene (PE), polycarbonate (PC), polymethylmethacrylate, polyvinyl chloride, polyacetate resin, casting resins, acrylates, fluorinated ethylene propylene, polyvinyl fluoride, and/or ethylene tetrafluoroethylene, or copolymers or mixtures thereof. The intermediate layer can be formed by one or a plurality of films arranged one atop another, wherein the thickness of a film is preferably from 0.025 mm to 1 mm, typically 0.38 mm or 0.76 mm. The intermediate layers can preferably be thermoplastic and, after lamination, adhesively bond the inner pane, the outer pane, and possible additional intermediate layers to one another.

The intermediate layer preferably has relative permittivity from 2 to 4 and particularly preferably from 2.1 to 2.9. With such relative permittivities, it was possible to obtain good differentiation between contacting the contact surface via the outer surface of the composite pane and the opposite inner surface.

The invention thus includes a pane arrangement with a window pane according to the invention or a composite pane according to the invention and a sensor electronics system that is electrically connected via a first connection region to the capacitive switching region and via a second connection region to the surrounding surface. The sensor electronics system is a capacitive sensor electronics system.

In an advantageous embodiment of the switching arrangement according to the invention, the sensitivity of the sensor electronics system is selected such that upon contact of the contact region with a human finger on the inner surface of the pane or of the composite pane, the sensor electronics system emits a switching signal and upon contact of the contact region on the outer surface of the pane or of the outer pane, emits no switching signal or a different switching signal. Of course, the contacting of the contact region can also be done with multiple fingers or a different human body part. In the context of this invention, "contacting" means any interaction with the switching region that results in a measurable change of the measurement signal, in this case, the capacitance. In particular, this is contacting of an outer surface of the window pane or of the composite pane in a zone obtained by orthogonal projection of the contact region onto the outer surface.

With a suitable selection of the sensitivity of the sensor electronics system and suitable dimensioning of the capacitive switching region, approaching the contact region can already suffice to trigger a switching signal. The pane arrangement according to the invention, wherein the low-E coating is arranged on the inner surface IV of the pane or inner pane, has a particularly advantageous high asymmetry in the switching behavior. In other words, the sensitivity is higher with approaching or contacting the inner surface IV (with the direct low-E coating) than with approaching or contacting the outer surface (III or I), where the pane or inner pane, intermediate layer, and outer pane is still arranged between the human body and the low-E coating with a capacitive switching region.

Of course, the sensitivity of the sensor electronics system can also be selected such that a switching procedure is triggered upon contacting or approaching from both sides of the surfaces.

In the context of the invention, "approaching" means approaching of a human body to 20 cm or less, preferably to 10 cm or less, and in particular, to 5 cm or less, without direct contact occurring.

The switching signal emitted can be adapted as desired to the requirements of the respective use. Thus, the switching signal can mean a positive voltage, for example, 12 V, no switching signal can mean, for example, 0 V, and another switching signal can mean, for example, +6 V. The switching signals can also correspond to the voltages CAN_High and CAN_Low customary with a CAN-Bus and change by a voltage value between them. The switching signal can also be pulsed and/or digitally coded.

The sensitivity of the sensor electronics system can be determined as a function of the size of the contact zone and as a function of the thickness of the pane or inner pane, intermediate layer or layers, and outer pane in the context of simple experiments.

The particular advantage of such a pane according to the invention resides in that the switching signal can be triggered only by approaching or contacting the window pane or the composite pane from one of the inner surfaces. In the case of a use of the pane arrangement in a motor vehicle window and installation of the window or composite pane with the inner surface in the direction of the vehicle interior, it is possible, for example, to reliably avoid triggering the switching procedure by individuals from the outside or an unwanted triggering of the switching procedure by rain or the movement of the windshield wiper, without fundamentally altering the customary pane construction. This was unexpected and surprising for the person skilled in the art.

In combination or alternatively, the sensitivity of the sensor electronics system can be selected such that it emits a switching signal upon approach of the contact region or upon contact with the contact region on the surfaces of the window pane or composite pane with a human finger and it emits no switching signal or a different switching signal upon contact of the supply line region on the surfaces of the window pane or the composite pane.

The sensitivity of the sensor electronics system can be determined as a function of the size of the contact region and as a function of the geometry as well as the aspect ratio between the width and length of the supply line region in the context of simple experiments. It is particularly advantageous for the width of the supply line region to be selected as small as possible.

The particular advantage of this embodiment of a pane arrangement according to the invention resides in the fact that the switching signal can be triggered only by contacting the outer surface of the window pane or composite pane via the contact region or its immediate surroundings and, thus, precise control of the switching procedure is possible, and, for example, inadvertent switching is prevented.

In an advantageous improvement of a pane arrangement according to the invention, the connection region is connected to a flat conductor, a metal wire, in particular a round conductor or a stranded conductor, and is routed away from the pane surface. The integrated pane arrangement can then be particularly simply connected, at the place of use, to a voltage source and to a signal line, which evaluates the switching signal of the sensor circuit, for example, in a vehicle via a CAN-Bus.

In principle, all electrically insulating substrates that are thermally and chemically stable as well as dimensionally stable under the conditions of production and use of the window pane or composite pane according to the invention are suitable as a pane or inner pane and outer pane.

The pane or the inner pane and the outer pane preferably contain glass, particularly preferably flat glass, float glass, quartz glass, borosilicate glass, soda lime glass, or clear plastics, preferably rigid clear plastics, in particular polyethylene, polypropylene, polycarbonate, polymethylmethacrylate, polystyrene, polyamide, polyester, polyvinyl chloride, and/or mixtures thereof. The pane or the inner pane and the outer pane are preferably transparent, in particular for the use of the pane as a windshield or rear window of a vehicle or other uses where high light transmittance is desired. In the context of the invention, "transparent" means a pane that has transmittance greater than 70% in the visible spectral range. However, for panes that are not situated in the traffic-relevant field of vision of the driver, for example, for roof panels, the transmittance can also be much lower, for example, greater than 5%.

The thickness of the pane or of the inner pane and of the outer pane can vary widely and thus be ideally adapted to the requirements of the individual case. Preferably, standard thicknesses from 1.0 mm to 25 mm, preferably from 1.4 mm to 2.5 mm are used for vehicle glass and, preferably, from 4 mm to 25 mm for furniture, appliances, and buildings. The size of the window pane and of the composite pane can vary widely and is governed by the size of the use according to the invention.

The window pane and the composite pane have, for example, in motor vehicle engineering and the architectural sector, customary areas of 200 cm$^2$ up to 20 m$^2$.

The window pane or composite pane can have any three-dimensional shape. Preferably, the three-dimensional shape has no shadow zones such that it can, for example, be coated by cathodic sputtering. Preferably, the panes are planar or slightly or greatly curved in one or a plurality of spatial directions. In particular, planar panes are used. The panes can be colorless or colored.

The pane or the inner pane and the outer pane preferably have relative permittivity $\varepsilon_{r,1/4}$, from 2 to 8 and particularly preferably from 6 to 8. With such relative permittivities, it was possible to obtain a particularly good differentiation between contacting the contact surface via the outer surface of the window pane or the composite pane and the opposing inner surface.

In an advantageous embodiment of the window pane according to the invention or the composite pane according to the invention, the connection region is arranged at the outer edge of the pane. The distance from the outer edge is preferably less than 10 cm, particularly preferably less than 0.5 cm. This makes it possible to conceal an electrical contacting of the connection region, for example, with a foil conductor, under an optically inconspicuous black imprint or with a covering, for example, a camera housing.

The electrical supply line is preferably implemented as a foil conductor or a flexible foil conductor (flat conductor, flat band conductor). The term "foil conductor" means an electrical conductor whose width is clearly greater than its thickness. Such a foil conductor is, for example, a strip or band containing or made of copper, tinned copper, aluminum, silver, gold, or alloys thereof. The foil conductor has, for example, a width of 2 mm to 16 mm and a thickness of 0.03 mm to 0.1 mm. The foil conductor can have an insulating sheathing, preferably polymeric, for example, based on polyimide. Foil conductors that are suitable for the contacting of electrically conductive coatings in panes, have a total thickness of, for example, merely 0.3 mm. Such thin foil conductors can be arranged simply and aesthetically on the inner surface IV and, for example, glued on. Multiple conductive layers electrically isolated from one another can be situated in a foil conductor strip.

Alternatively, thin metal wires can also be used as an electrical supply line. The metal wires contain in particular copper, tungsten, gold, silver, or aluminum or alloys of at least two of these metals. The alloys can also contain molybdenum, rhenium, osmium, iridium, palladium, or platinum. The metal wires can be made of one or a plurality of individual wires or strands that are arranged round or flat or in any shape overall. The individual wires or strands can be implemented electrically isolated from one another inside multi-wire cables.

The electrical line connection between the connection region and the electrical supply line is preferably done via electrically conductive adhesives, which enable a reliable and durable electrical line connection between the connection region and the supply line. Alternatively, the electrical line connection can also be made by clamping. Alternatively, the supply line can also be printed onto the connection region, for example, by means of a fired metal-containing and in particular silver-containing, electrically conductive printing paste.

In an alternative embodiment, the electrical line connection between connection region and the electrical supply line is made by soldering, preferably by ultrasonic soldering. Alternatively, another connection element can be arranged between the connection region and the electrical supply line, for example, a mounting foot, a crimp element, or a multi-pin connector. The electrical supply line can be connected directly to the connection element, or fixedly or detachably connected thereto via a plug or a coupling.

A closed crimp element can, for example, have an oval (oval crimp) or polygonal (for example, square crimp, hexagonal crimp, or trapezoidal crimp) cross-section. One of the active points of the crimping tool can also produce a characteristic crimp structure, with the crimped structure typically arranged opposite the so-called crimp base. The shape of the crimping is typically named according to the characteristic crimp structure. Shapes for a closed crimp are known to the person skilled in the art, for example, as W-crimps or mandrel crimps. In the case of an open crimp element, the two side edges of the connection element bent around the connection cable are crimped with one another with a characteristic crimp structure and crimped with the connection cable. Shapes for an open crimp are known to the person skilled in the art, for example, as B-crimps (or F-crimps), Ü-crimps (OVL-crimps/overlapping crimps), or O-crimps. Such crimp elements are usually soldered onto the connection region or glued using a conductive adhesive. In this case, crimp elements with a flat region, for example, a flat crimp base are particularly advantageous.

In an advantageous embodiment of the window pane or composite pane, the contact region is directly markable or marked by an active light source, preferably by a light emitting diode (LED), an organic light emitting diode (OLED), an incandescent light bulb, or other active luminary, such as a luminescent material, preferably a florescent or phosphorescent material.

In an alternative embodiment of the window pane or composite pane, the contact region is marked by a colored, preferably a white or black, imprint, for example, a screen-print, on the pane or the inner pane, the intermediate layer, or the cover pane. This has the particular advantage that the contact region is marked durably and independently of a voltage source. The imprint can also contain a luminescent material, preferably a florescent or phosphorescent material and/or be luminescent.

In another alternative embodiment of the invention, the window pane or composite pane has a light irradiation means and a light deflection means. The light irradiation means and the light deflection means are, for example, arranged on the window pane or in or on the composite pane, preferably between the inner pane and the outer pane.

According to the invention, the light irradiation means comprises at least one light source, preferably an LED or OLED. The particular advantage resides in the small dimensions and the low power consumption. The wavelength range emitted by the light source can be selected freely in the range of visible light, for example, based on practical and/or aesthetic considerations. The light irradiation means can include optical elements, in particular for directing the light, preferably a reflector and/or a light waveguide, for example, a glass fiber or a polymeric optical fiber. The light irradiation means can be arranged at any location of the pane or of the inner pane or outer pane, in particular on the side edge of the window pane or composite pane or in a small recess in the middle of the inner pane and outer pane.

The light deflection means preferably includes particles, dot grids, stickers, deposits, notches, incisions, line grids, imprints, and/or screen prints and is suitable for decoupling the light transported in the pane or inner pane, intermediate layer, or outer pane therefrom.

The light deflection means can be arranged at any position on the level of the pane or inner pane, intermediate layer, or outer layer. It is particularly advantageous for the light deflection means to be arranged in the region of or in the immediate vicinity of the contact region and thus to enable rapid finding of the otherwise hardly visible contact region. This is particularly advantageous at night or in darkness.

Alternatively, light can be routed to the contact region through a light guide that is arranged on the pane or inner pane, intermediate layer, or outer layer and can mark the contact region.

Alternatively or in combination, the light irradiation means together with the light deflection means can visualize information on the window pane or the composite pane, for example, report or display the switching state of the capacitive switching region, whether, for example, an electrical function is switched on or switched off.

Another aspect of the invention includes a method for producing such a pane arrangement with a window pane or a pane with a capacitive switching region, at least comprising:

Applying a low-E coating on an inner surface (IV) of the pane,

Introducing at least one first partition line into the low-E coating, by which at least one capacitive switching region is electrically isolated from a surrounding region of the low-E coating, wherein the surrounding region surrounds the capacitive switching region at least in sections, in particular completely, preferably by laser patterning or by mechanical or chemical ablation, Introducing at least one second partition line into the low-E coating, by which the surrounding region is electrically isolated from an outer region of the low-E coating, wherein the outer region at least partially, in particular completely, surrounds the surrounding region, preferably by laser patterning or by mechanical or chemical ablation.

If the pane is implemented as a composite pane, the following steps can be included:

Applying a low-E coating on an inner surface (IV) of an inner pane and introducing at least one first partition line into the low-E coating, by which at least one capacitive switching region is electrically isolated from a surrounding region of the low-E coating, wherein the surrounding region surrounds the capacitive switching region at least in sections, in particular completely, preferably by laser patterning or by mechanical or chemical ablation, as well as introducing at least one second partition line into the low-E coating, by which the surrounding region is electrically isolated from an outer region of the low-E coating, wherein the outer region at least partially, in particular completely, surrounds the surrounding region, preferably by laser patterning or by mechanical or chemical ablation, Producing a stack sequence of the inner pane, an intermediate layer, and an outer pane, wherein the intermediate layer is arranged between the inner surface (II) of the outer pane and the outer surface (III) of the inner pane, and laminating the stack sequence to form a composite pane.

In other words, a pane of the pane arrangement according to the invention is produced first and this is laminated in a second step from a stack sequence of the inner pane (which consists of the window pane according to the invention), the intermediate layer, and the outer pane to form a composite pane.

In an alternative embodiment of the method according to the invention for producing a pane arrangement with a composite pane with a capacitive switching region, the process steps can also be interchanged. In other words, a laminate is first formed from the stack sequence of the inner pane, intermediate layer, and outer pane and, thereafter, the low-E coating is deposited on the inner surface of the inner pane and this is patterned.

The application of the low-E coating can be done by methods known per se, preferably by magnetically enhanced cathodic sputtering. This is particularly advantageous in terms of simple, quick, economical, and uniform coating of the panes. However, the electrically conductive layer can also be applied, for example, by vapor deposition, chemical vapor deposition (CVD), plasma-enhanced chemical vapor deposition (PECVD), or by wet chemical processes.

The de-coating of individual partition lines in the low-E coating is preferably done by a laser beam. Methods for patterning thin metal films are known, for example, from EP 2 200 097 A1 or EP 2 139 049 A1. The width of the de-coating is preferably 10 μm to 1000 μm, particularly preferably 30 μm to 200 μm, and in particular 70 μm to 140 μm. In this range, a particularly clean and residue-free de-coating by the laser beam takes place. De-coating by laser beam is particularly advantageous since the de-coated lines are optically very inconspicuous and impact the appearance and the transparency only a little. The de-coating of a line with a width that is wider than the width of a laser cut is done by repeated wearing down of the line with the laser beam. Consequently, the process duration and the process costs increase with increasing line width. Alternatively, the de-coating can be done by mechanical ablation as well as by chemical or physical etching.

The lamination, i.e., the bonding of the inner pane, intermediate layer, and outer pane is preferably done under the action of heat, vacuum, and/or pressure. Methods known per se for producing a composite pane can be used.

Thus, for example, so-called autoclave methods can be performed at an elevated pressure of approx. 10 bar to 15 bar and temperatures from 130° C. to 145° C. over approx. 2 hours. Vacuum bag or vacuum ring methods known per se operate, for example, at approx. 200 mbar and 80° C. to 110° C.

The inner pane, the, for example, thermoplastic intermediate layer, and the outer pane can also be pressed in a calender between at least one pair of rollers to form a pane. Systems of this type are known for producing panes and normally have at least one heating tunnel upstream before a pressing facility. The temperature during the pressing procedure is, for example, from 40° C. to 150° C. Combinations of calender and autoclave processes have particularly proved their worth in practice. Alternatively, vacuum laminators can be used. These consist of one or a plurality of heatable and evacuable chambers, in which the inner pane and the outer pane are laminated within, for example, approx. 60 minutes at reduced pressures of 0.01 mbar to 800 mbar and temperatures from 80° C. to 170° C.

As a further process step, the galvanic contacting of the low-E coating can be done by an electrical line connection. The galvanic contacting is preferably done by gluing with an electrically conductive adhesive, soldering, and, in particular, ultrasonic soldering.

In the galvanic contacting, it can be advantageous to first apply an electrically conductive contact layer on the low-E coating, for example, by metallization or by printing using a metal-containing screenprinting paste and subsequent firing. This contact layer is particularly advantageous for obtaining a low ohmic and corrosion resistant contact between the conductive components of the low-E coating and the other connection elements such as foil conductors or round conductors.

Another aspect of the invention includes the use of the pane arrangement according to the invention with a window pane or composite pane with a capacitive switching region in buildings, in particular in the access area, window area, roof area, or façade area, as a built-in component in furniture and appliances, in means of transportation for travel on land, in the air, or on water, in particular in trains, watercraft, and motor vehicles, for example, as a windshield, rear window, side window, and/or roof panel.

The invention further includes the use of the capacitive switching region of a pane arrangement according to the invention with a window pane or composite pane for the electrical control of a function inside or outside the window pane or composite pane, preferably a heating function, lighting, in particular a lighting means arranged on or in the window pane or composite pane such as an LED, a change in the optical transparency of a functional intermediate layer, in particular a suspended particle device (SPD) layer or an electrochromic intermediate layer.

In the following, the invention is explained in detail with reference to drawings and exemplary embodiments. The drawings are a schematic representation and not true to scale. The drawings in no way restrict the invention.

Figure 1B:
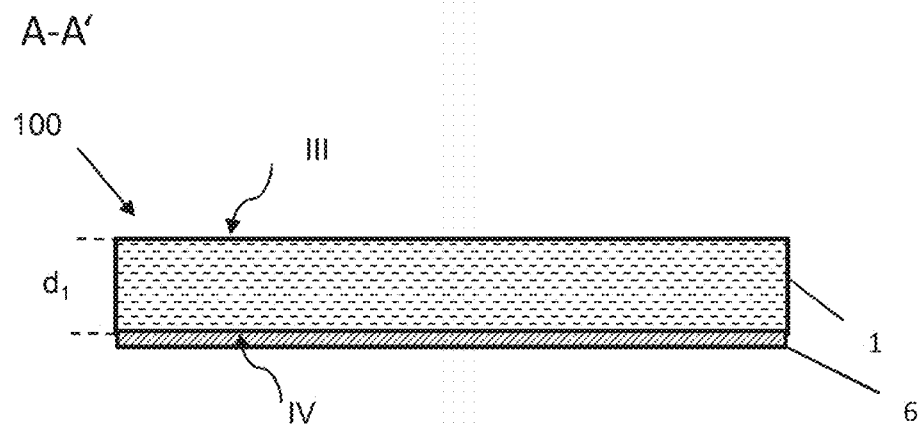
Figure 1C:
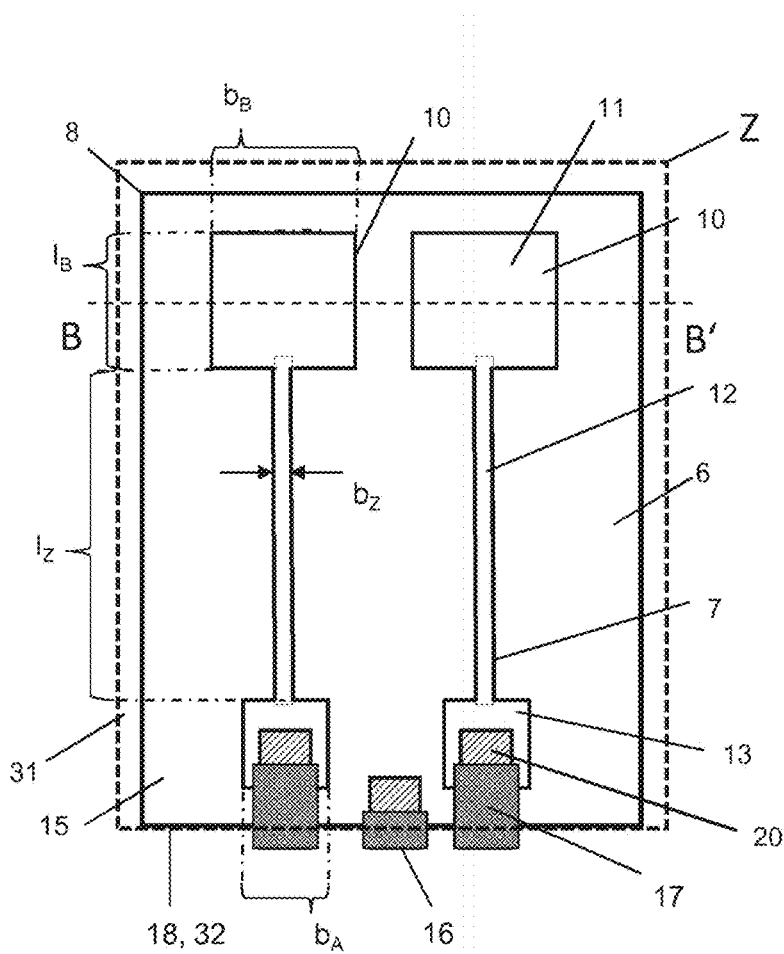
Figure 1D:
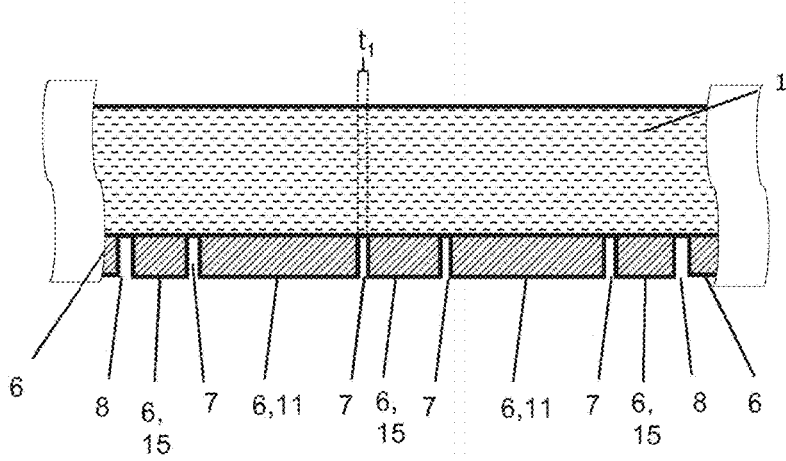
Figure 1E:
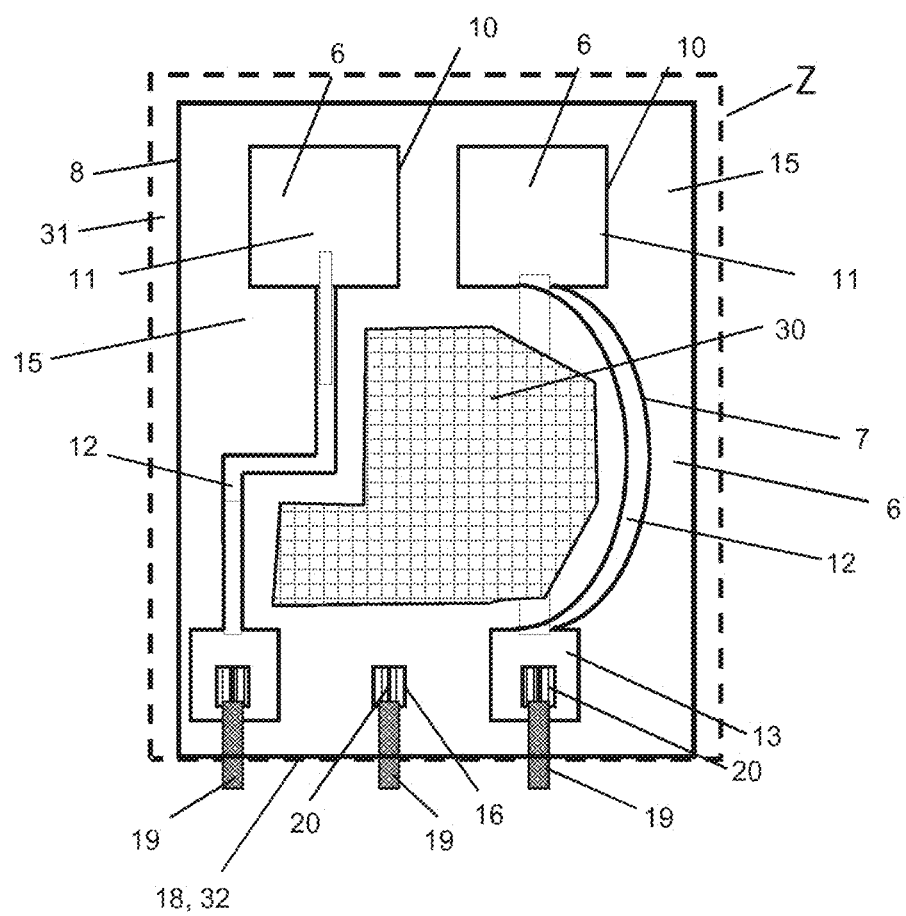
Figure 1F:
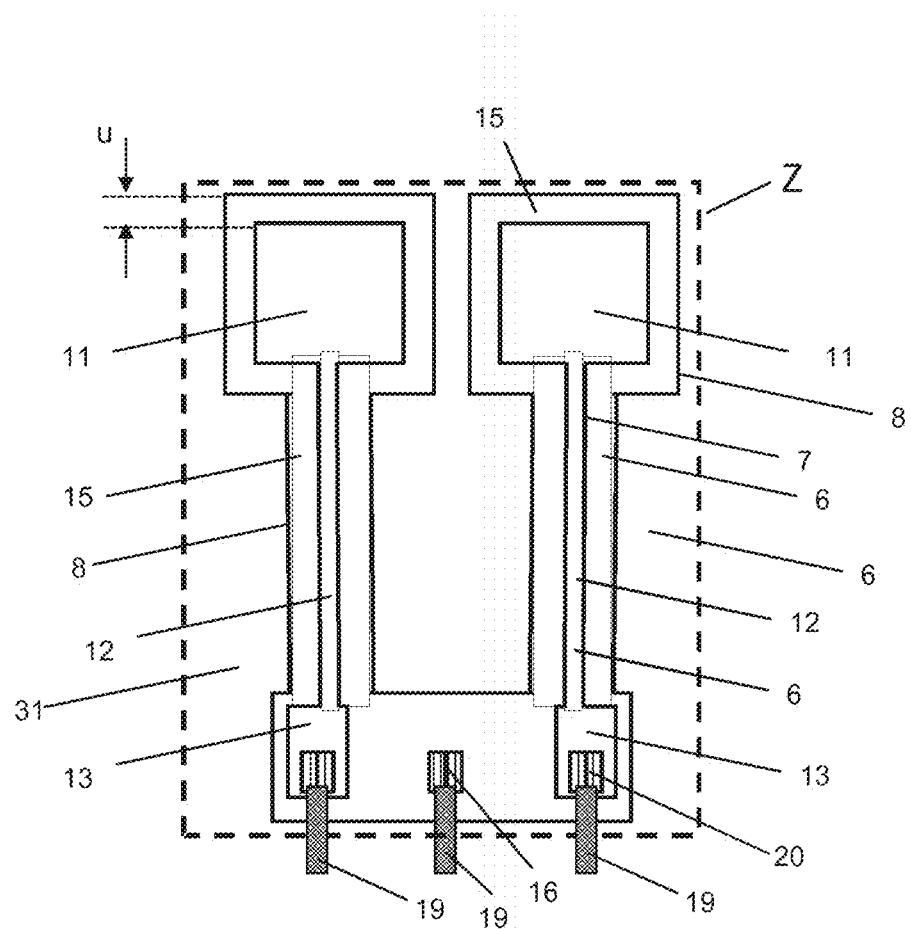
Figure 2A:
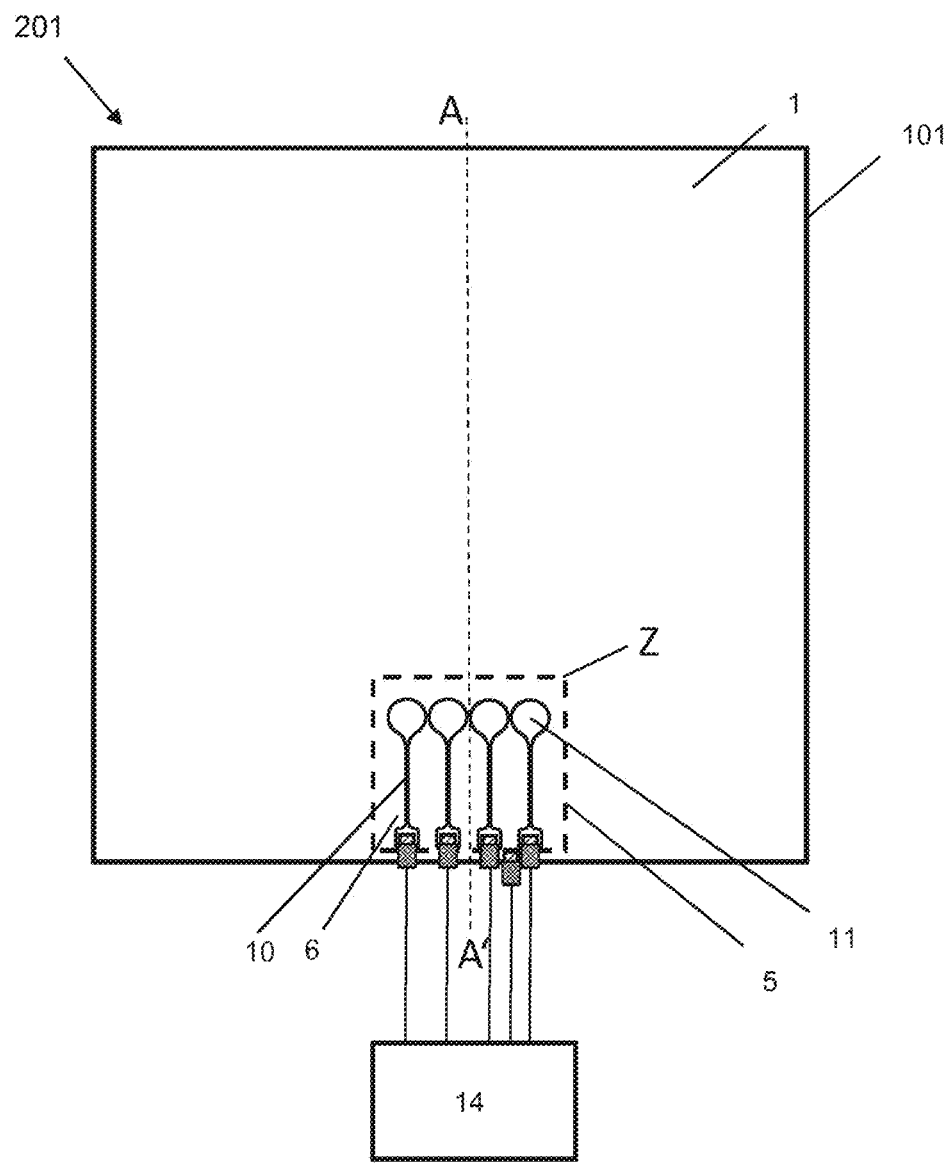
Figure 2B:
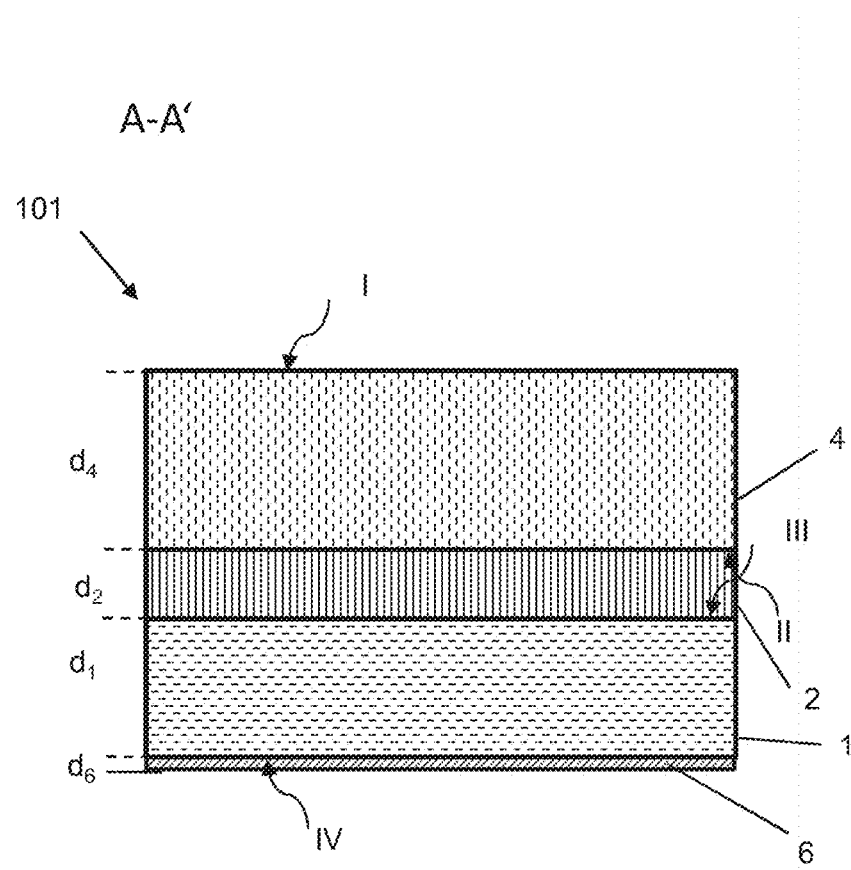
Figure 2C:
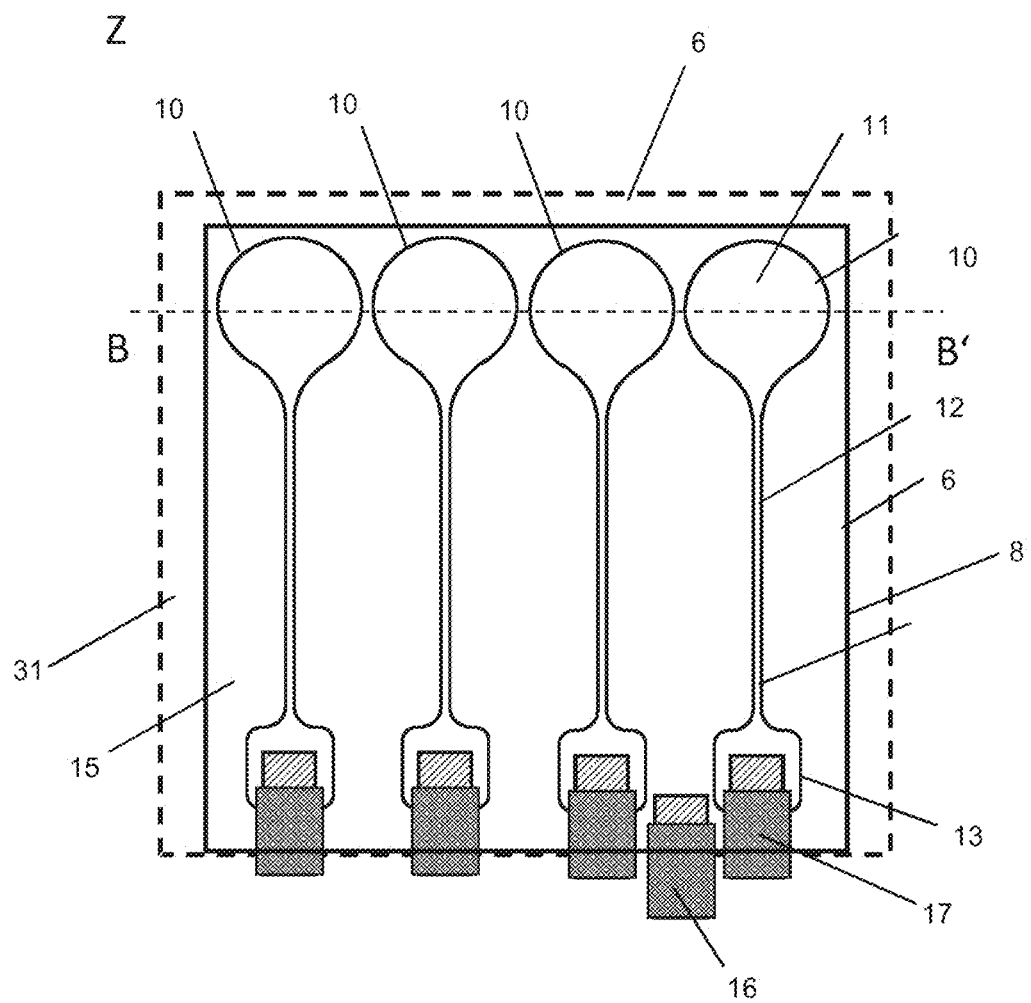
Figure 2D:
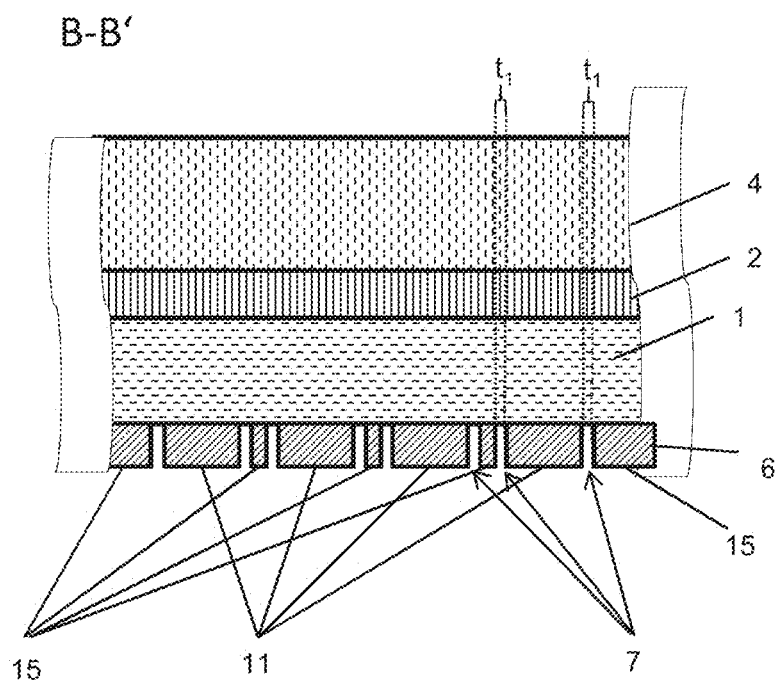
Figure 2E:
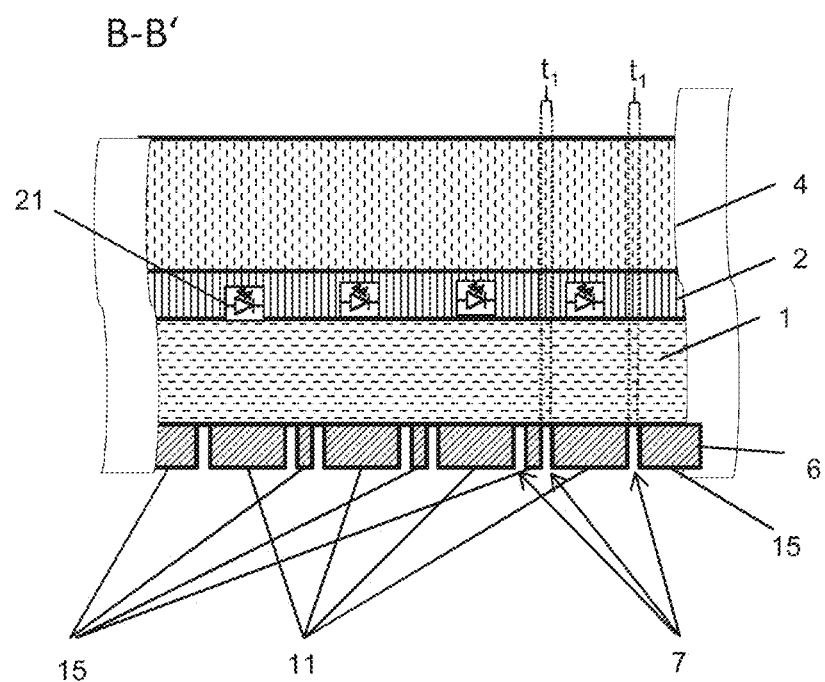
Figure 2F:
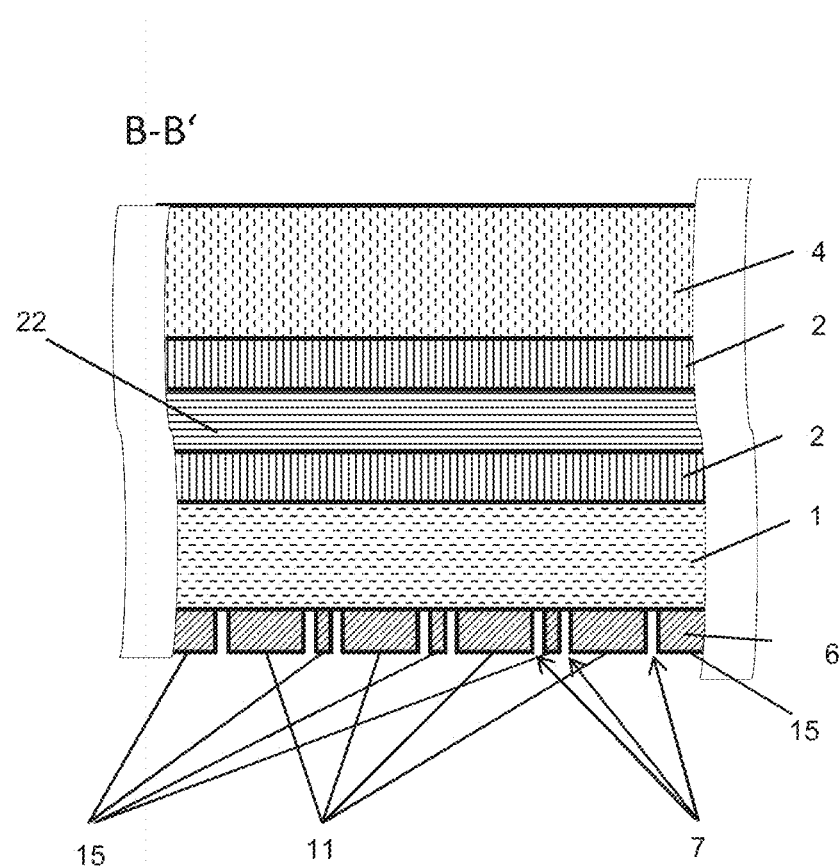
Figure 3A:
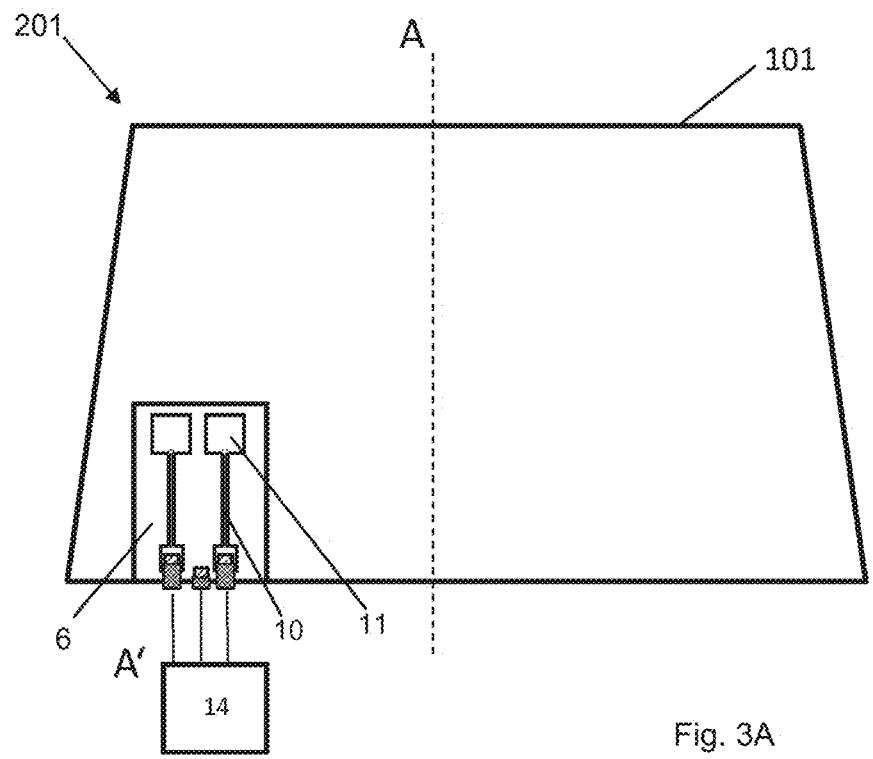
Figure 3B:
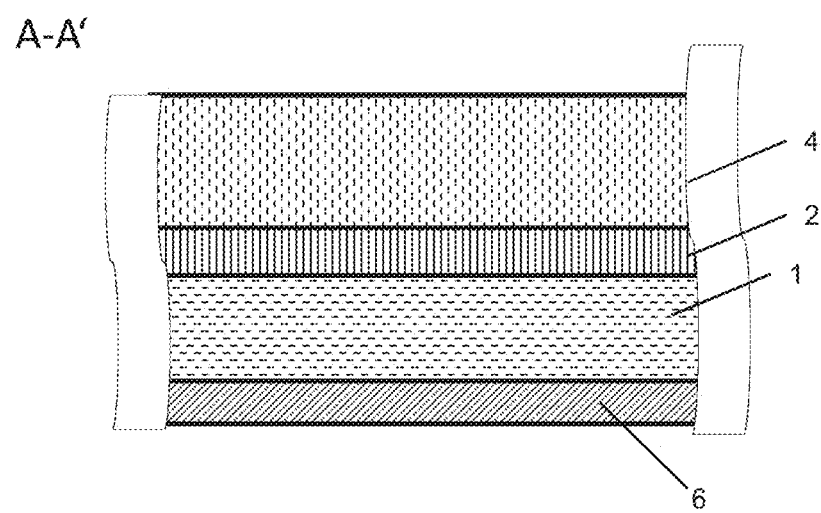
Figure 4B:
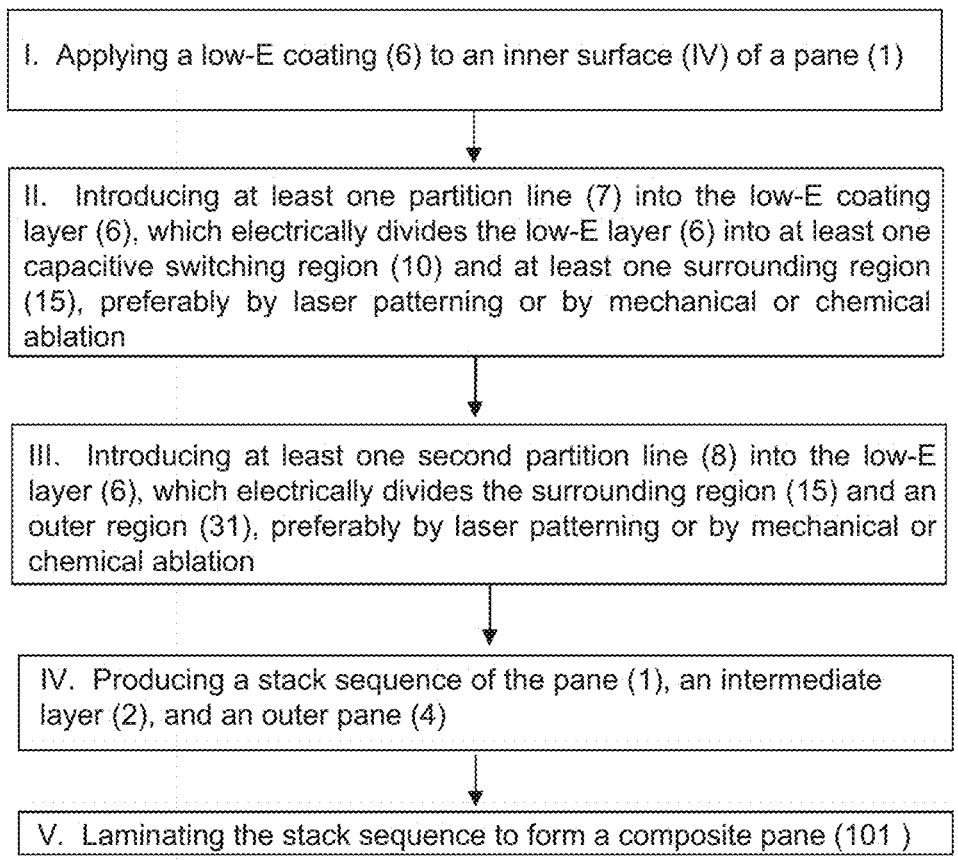

They depict:

FIG. 1A a plan view of an embodiment of a pane arrangement according to the invention with a window pane;

FIG. 1B a cross-sectional view along the section line A-A' of FIG. 1A;

FIG. 1C an enlarged view of the detail Z of FIG. 1A;

FIG. 1D a cross-sectional view along the section line B-B' of FIG. 1C;

FIG. 1E an enlarged view of a detail Z according to FIG. 1A of an alternative embodiment of the window pane;

FIG. 1F an enlarged view of a detail Z according to FIG. 1A of another alternative embodiment of the window pane;

FIG. 2A a plan view of an alternative embodiment of a pane arrangement according to the invention with a composite pane;

FIG. 2B a cross-sectional view along the section line A-A' of FIG. 2A;

FIG. 2C an enlarged view of the detail Z of FIG. 2A;

FIG. 2D a cross-sectional view along the section line B-B' of FIG. 2C;

FIG. 2E a cross-sectional view along the section line B-B' of FIG. 2C of another alternative embodiment of the composite pane;

FIG. 2F a cross-sectional view along the section line B-B' of FIG. 2C of another alternative embodiment of the composite pane;

FIG. 3A a plan view of another alternative embodiment of the pane arrangement according to the invention with a composite pane using the example of a windshield;

FIG. 3B a cross-sectional view along the section line A-A' of FIG. 3A;

FIG. 4A a detailed flowchart of an embodiment of the method according to the invention for producing a window pane; and FIG. 4B a detailed flowchart of an embodiment of the method according to the invention for producing a composite pane.

FIG. 1A depicts a plan view of an exemplary embodiment of a pane arrangement 200 according to the invention with a window pane 100 using the example of a roof panel of a motor vehicle.

FIG. 1B depicts a cross-sectional view along the section line A-A' of FIG. 1A. Here, the window pane 100 comprises, for example, a single pane 1. The window pane 100 is, for example, a vehicle window and in particular the roof panel of a passenger car. The dimensions of the window pane 100 are, for example, 0.9 m×1.5 m. The window pane 100 includes a pane 1, which is intended, for example, in the installed position, to separate a vehicle interior from an external environment. In other words, the inner surface IV of the pane 1 is accessible from the interior out, whereas the outer surface III of the pane 1 faces outward relative to the vehicle interior. The pane 1 is made, for example, of soda lime glass and was produced in the float process. The thickness $d_1$ of the pane 1 is, for example, 2.1 mm. In principle, the pane 1 can also have other thicknesses. Thus, the pane 1 can, for example, as architectural glazing, have a thickness of 4 mm.

The pane 1 was, for example, subjected to a tempering treatment and is thus a single-pane safety glass.

The inner surface IV of the pane 1 is coated with a low-E coating 6. Table 1 presents three examples of low-E coatings 6 according to the invention with functional layers made, for example, of ITO. Each low-E coating 6 of the Examples 1-3 consists of a layer stack of: pane 1/adhesive layer/functional layer/barrier layer/antireflection layer.

TABLE 1

| | | Thickness | | |
| --- | --- | --- | --- | --- |
| | Material | Example 1 | Example 2 | Example 3 |
| Antireflection layer | SiO$_2$:Al | 45 nm | 40 nm | 80 nm |
| Barrier layer | Si$_3$N$_4$:Al | 12 nm | 20 nm | 12 nm |
| Functional layer | ITO | 120 nm | 120 nm | 120 nm |
| Adhesive layer | SiO$_2$:Al | 30 nm | 30 nm | 40 nm |
| Pane or inner pane 1 | Soda lime glass | | | |

The low-E coating 6 depicted in FIG. 1A consists, for example, of the layer system of Example 1 of Table 1. In another example, the low-E coating 6 depicted in FIG. 1A consists of the layer system of Example 2 of Table 1, and in another example, of the layer system of Example 3 of Table 1.

The window pane 1 with the layer systems mentioned by way of example of Example 1-3 have an interior-side, normal total emissivity less than or equal to 30% and sheet resistance of 20 ohm/square to 30 ohm/square. The window pane has, in reflection, for example, a color value a* of −3 to +4 and a color value b* of −7 to +4, viewed from the side provided with the low-E coating 6. Such a window pane 1 can be clear and have, for example, a transparency greater than or equal to 80% in the visible range. To avoid glare in the visible range from sunlight, the pane 1 also can be highly tinted and only have a transparency less than or equal to 20% in the visible range. Of course, the low-E coating 6 can also consist of different layer systems with low emissivity.

In the lower section of the window pane 100, the low-E coating 6 has, for example, two capacitive switching regions 10.

FIG. 1C depicts an enlarged view of the detail Z of the window pane 100 of FIG. 1A with the capacitive switching region 10. FIG. 1D depicts an associated cross-sectional view along the section line B-B' of FIG. 1C.

The low-E coating 6 is divided by coating-free first partition lines 7 into different regions, electrically isolated from one another. In this example, "electrically isolated" means that the regions are galvanically separated from one another; in other words, that no direct-current (DC) can flow between the regions. In the example depicted in FIG. 1C, two capacitive switching regions 10 are electrically divided from a common surrounding region 15. The first partition lines 7 are closed in each case. The surrounding region 15 completely surrounds the two capacitive switching regions 10. At one pane edge 18 (lower edge in FIG. 1C) of the window pane 100 or pane 1, the surrounding region 15 extends all the way to the coating edge 32 of the low-E coating 6. In the present exemplary embodiment, the edge of the low-E coating 6 extends all the way to the edge of the pane 1, being equally conceivable that the edge of the low-E coating 6 be set back relative to the edge of the pane 1.

The surrounding region 15 is electrically separated from an (outer) region 31 of the low-E coating 6 surrounding the surrounding region 15, by a second partition line 8 which partially surrounds the two capacitive switching regions 10 and is formed in the low-E coating. The second partition line 8 is formed in the low-E coating 6. The second partition line 8 is not closed and extends freely ending all the way to the coating edge 32 of the low-E coating 6, with the second partition line 8 not present there, where the surrounding region 15 extends all the way to the coating edge 32. The outer region 31 thus surrounds the surrounding region 15 only partially, not completely. The surrounding region 15 and the outer region 31 (i.e., regions of the low-E coating 6 distinct from one another that are separated from one another by the second partition line 8) are thus regions of the low-E coating 6 electrically isolated from one another. This means that the surrounding region 15 and the outer region 31 are galvanically separated from one another such that no direct-current (DC) can flow between the surrounding region 15 and the outer region 31. It is, however, also conceivable for the surrounding region 15 not to extend all the way to the coating edge 32, the second partition line 8 being closed in this case and completely surrounding the surrounding region 15. In this case, the outer region 31 completely surrounds the surrounding region 15.

Each switching region 10 includes a contact region 11, which is formed approx. square and transitions into a strip-shaped supply line region 12. The width $b_B$ and the length $l_B$ of the contact region 11 is, in each case, for example, 40 mm. The width $b_Z$ of the supply line region 12 is, for example, 1 mm. The ratio $b_Z:b_B$ is thus approx. 1:40. The supply line region 12 is connected to a first connection region 13. The first connection region 13 has a square shape and an edge length $b_A$ of, for example, 12 mm. The length $l_Z$ of the supply line region is approx. 48 mm. The surrounding region 15 is again separated from the remaining low-E coating 6 by a first partition line 7. Here, the surrounding region 15 is rectangular in design and includes both capacitive switching regions 10. The surrounding region 15 has another or second connection region 16. The second connection region 16 can be arranged anywhere within the surrounding region 15. In the example depicted, it is arranged on the lower edge of the surrounding region 15 at the lower edge of the pane 1. Thus, it is visually unobtrusive and hardly impairs vision through the pane.

The first partition line 7 has a width $t_1$ of, for example, merely 100 µm and is, for example, introduced into the low-E coating 6 by laser patterning. The same applies to the second partition line 8. Partition lines 7, 8 with such a low width are scarcely perceptible visually and hardly disrupt vision through the pane 100, which is particularly aesthetic and is of particular importance for driving safety, particularly for use in the field of vision of motor vehicles.

The first connection region 13 is electrically conductingly connected to a foil conductor 17 via an electrical line connection 20. Here, a reliable electrically conducting connection is preferably achieved by means of an electrically conductive adhesive. The foil conductor 17 consists, for example, of a 50-µm-thick copper foil and is, for example, isolated outside the first connection region 13 with a polyimide layer. As a result, the foil conductor 17 can be routed out without an electrical short circuit beyond the surrounding region 15 via the lower edge of the window pane 100. Of course, the electrical line connection of the second connection region 16 can be routed outward either via insulated wires or via a region, in which the low-E coating of the surrounding region is interrupted.

Here, the foil conductor 17 is, for example, connected, outside the window pane 100, to a capacitive sensor electronics system 14. Moreover, the surrounding region 15 is likewise connected to the sensor electronics system 14 via the second connection region 16. The sensor electronics system 14 is suited for precisely measuring capacitance changes of the switching region 10 relative to the surrounding region 15 and to relay a switching signal, for example, to the CAN-bus of a vehicle as a function of a threshold value. Any functions can be switched in the vehicle via the switching signal. For example, lighting in or on the window pane 100 can be switched on or off.

If the window pane 100 is, for example, used as a roof panel in a motor vehicle, the length of the supply line region 12 can be selected such that the driver of the vehicle, the front-seat passenger, or back-seat occupants of the vehicle conveniently reach the contact region 11 of the switching region 10.

In the exemplary embodiment depicted, the structure and the fine-tuning of the sensor electronics system 14 are coordinated such that upon contact of the inner surface IV of the pane 1 via the contact region 11 of the capacitive switching region 10, a switching signal is triggered, whereas upon contact of the outer surface III of the pane 1 via the capacitive switching region 10, no switching signal is triggered.

Moreover, in this example, the area of the contact region 11 and in particular its width $b_B$ is coordinated with the width $b_Z$ of the supply line region 12 such that only upon contacting the inner surface IV of the pane 1 via the contact region 11 (i.e., in that region of the surface IV resulting from orthogonal projection of the contact region 11 onto the surface IV), a switching signal is emitted and not upon contact of the surface IV via the supply line region 12.

FIG. 1E depicts an enlarged view of a detail Z of FIG. 1A of an alternative embodiment of the window pane 100. The exemplary embodiment depicted corresponds substantially in structure to the window pane 100 of FIG. 1A, such that in the following only the respective differences are dealt with. The low-E coating 6 has, in this example, a coating-free region 30, which serves, for example, as a communication window and is transparent to electromagnetic radiation, for example, to GSP reception or mobile telephony. In the exemplary embodiment depicted here, the supply line regions 12 are consequently not configured rectilinearly, but are routed around the coating-free region 30. In the supply line region 12, which belongs to the capacitive switching region 10 arranged on the left in FIG. 1E, the supply line region 12 is, for example, implemented as a strip-shaped region with two right angles (double-L structure).

In the supply line region 12, which belongs to the capacitive switching region 10 arranged on the right in FIG. 1E, the supply line region 12 is, for example, implemented as an arc-shaped region. Of course, any other suitable path of the supply line region 12 is also possible.

The surrounding region 15 is, in this example, separated from the surrounding low-E coating by a second second partition line 8 such that the entire surrounding low-E coating 6 cannot act as surrounding region 15. Here, the surrounding region 15 of the low-E coating 6 is connected to the capacitive sensor electronics system 14 by means of a second connection region 16.

Moreover, in this exemplary embodiment, the first connection regions 13, or the second connection region 16, are electrically conductingly connected to metallic wires in the form of round conductors 19 insulated with plastic. The electrical line connection 20 between connection region 13,19 and round conductor 19 is done via a crimp element that is crimped onto one end of the round conductor 19, with the crimp element electrically conductingly connected to the connection region 13, 19 by ultrasonic soldering.

FIG. 1F depicts an enlarged view of a detail Z of FIG. 1A of another alternative embodiment of the window pane 100. The exemplary embodiment depicted corresponds substantially in structure to the window pane 100 of FIG. 1A, such that, in the following, only the respective differences are dealt with.

In this example, the surrounding region 15 or the second partition line 8 is implemented like a frame around the capacitive switching region 10 and, thus, around the contact region 11, the supply line region 12, and the connection region 13. The second partition line 8, which separates the immediate surrounding region 15 from the capacitive switching region 10 or the first partition line 8, has a (shortest) distance u between 5 mm and 10 mm from the contact region 11, from the supply line region 12, and, in sections, from the connection region 13 and, thus, defines the width of the surrounding region 15. Only in the connection region 13, 16 is the distance and, thus, the width u of the surrounding region 15 designed larger, so that sufficient space is available for the additional connection element 16 for the electrical contacting of the surrounding region 15.

Such a frame-shaped design of the surrounding region 15 is particularly advantageous since, by this means, a particularly good signal quality of the capacitive switching region 10 can be achieved. Moreover, the separation of the surrounding region 15 from the outer region 31, in particular with a frame-shaped design of the surrounding region 15, advantageously enables the introduction of additional electrical devices into the low-E coating.

FIG. 2A depicts a plan view of an alternative exemplary embodiment of a pane arrangement 201 according to the invention with a composite pane 101.

FIG. 2B depicts a cross-sectional view along the section line A-A' of FIG. 2A. Here, the composite pane 101 comprises, for example, an inner pane 1 and an outer pane 4 that are bonded to one another via an intermediate layer 2. The inner pane 1 corresponds in its function to the pane 1 of FIG. 1A. The composite pane 101 is, for example, part of a façade glazing and, for example, a window that separates the interior of a building from an external environment. It is equally possible to also implement such a composite pane 100 as a vehicle glazing and, in particular, as a roof panel of a passenger car.

The dimensions of the composite pane 101 are, for example, 1.2 m×1.2 m. The inner pane 1 is, for example, intended, in the installation position, to be turned toward the interior. In other words, the inner surface IV of the inner pane 1 is accessible from the interior out, whereas the outer surface I of the outer pane 4 faces outward. Inner pane 1 and outer pane 4 are made, for example, of soda lime glass that was produced in a float process. Inner pane 1 and outer pane 4 can be non-tempered or tempered. The thickness $d_1$ of the inner pane 1 is, for example, 2.1 mm and the thickness $d_4$ of the outer pane 4 is, for example, likewise 2.1 mm. The intermediate layer 2 is a thermoplastic intermediate layer and is made, for example, of polyvinyl butyral (PVB). It has a thickness $d_2$ of, for example, 0.76 mm.

The inner surface IV of the inner pane 1 is coated with a low-E coating 6. The low-E coating 6 depicted in FIG. 2A consists, for example, of the layer system of Example 1 of Table 1. In another example, the low-E coating 6 depicted in FIG. 2A consists 6 of the layer system of Example 2 of Table 1 and in another example, consists of the layer system of Example 3 of Table 1.

In the central, lower section of the composite pane 101, the low-E coating 6 has a capacitive switching region 10. Of course, the capacitive switching region 10 can also be arranged in any other section of the composite pane 101.

FIG. 2C depicts an enlarged view of the detail Z of FIG. 2A. FIG. 2D depicts an associated cross-sectional view along the section line B-B' of FIG. 2C.

The low-E coating 6 is divided by coating-free first partition lines 7 into different regions, electrically isolated from one another. In the example depicted in FIG. 2C, four capacitive switching regions 10 are electrically divided from a common surrounding region 15. Each switching region 10 comprises a contact region 11, which is implemented approx. drop-shaped, and transitions into a strip-shaped supply line region 12. The width $b_B$ and the length $l_B$ of the contact region 11 is, in each case, for example, 40 mm. The width $b_Z$ of the supply line region 12 is, for example, 1 mm. The ratio $b_Z:b_B$ is thus approx. 1:40. The supply line region 12 is connected to a connection region 13. The connection region 13 has a square shape with rounded corners and a side length $b_A$ of, for example, 12 mm. The length $l_Z$ of the supply line region is approx. 48 mm.

The first partition line 7 has a width of, for example, merely 100 µm and is introduced into the low-E coating 6, for example, by laser patterning. Partition lines 7 with such a low width are scarcely perceptible visually and hardly disrupt vision through the composite pane 101, which is particularly aesthetic especially for use as windows of buildings or in vehicles as a roof panel. Also depicted is a second partition line 8, which completely surrounds the capacitive switching region 10 and completely separates the surrounding region 15 electrically from the outer region of the low-E coating 6.

The first connection region 13 is electrically conductingly connected to a foil conductor 17 via an electrical line connection 20. Here, a reliable electrically conducting connection is preferably achieved by means of an electrically conductive adhesive. The foil conductor 17 consists, for example, of a 50-µm-thick copper foil and is, for example, isolated outside the first connection region 13 with a polyimide layer. As a result, the foil conductor 17 can be routed out without an electrical short circuit beyond the surrounding region 15 via the lower edge of the window pane 101. Of course, the electrical connection of the first connection region 13 outward can be routed outward either via insulated wires or via a region of the low-E coating 6, in which the surrounding region 15 is interrupted.

Here, the foil conductor 17 is, for example, connected, outside the composite pane 101, to a capacitive sensor electronics system 14. Moreover, the surrounding region 15 is likewise connected to the sensor electronics system 14 via a second connection region 16. The sensor electronics system 14 is suited for precisely measuring capacitance changes of the switching region 10 relative to the surrounding region 15 and to relay a switching signal, for example, to the CAN-bus of a vehicle as a function of a threshold value. Any functions can be switched in the vehicle via the switching signal. For example, the composite pane 101 can have a suspended particle device (SPD) layer, an electrochromic layer, or a different type of layer or film for controlling optical transparency, which can be changed in its optical transparency by the switching signal, here, for example, with four levels of transparency, each of which can be selected via the four capacitive switching regions. Of course, alternatively or additionally, other electrical functions such as electrical heating or electrical lighting can be controlled. Such functional layers or components for controlling optical transparency, electrical heating, or electrical lighting can be arranged at any positions on or in the composite pane 101, and, for example, be laminated in via one or a plurality of intermediate layers in the interior of the composite pane 101.

FIG. 2E depicts an alternative embodiment, in which four light emitting diodes (LED) 21 were laminated into the composite pane 101 between inner pane 1 and outer pane 4. Likewise, one or a plurality of LEDs or light irradiation means on the edge of the composite pane 101 can couple light, for example, into the inner pane 1. The light then can be coupled out via light deflection means, such as roughening of the outer surface III of the inner pane 1 in the region of the capacitive switching region 10 and can optically mark it.

FIG. 2F depicts another alternative embodiment, in which a functional intermediate layer 22 was laminated into the composite pane 101 between inner pane 1 and outer pane 4. Here, the functional intermediate layer 22 is connected to the inner pane 1 and the outer pane 4, for example, via two thermoplastic intermediate layers 2 made of a PVB film. The functional intermediate layer 22 has, for example, an electrically controllable, optical transparency and preferably includes a suspended particle device (SPD) layer or an electrochromic intermediate layer.

If the composite pane 101 is used, for example, as a roof panel in a motor vehicle, the length of the supply line region 12 can be selected such that the driver of the vehicle, the front-seat passenger, or back-seat passengers can conveniently reach the contact region 11 of the switching region 10. Of course, for this, a plurality of capacitive switching regions 10 can also be arranged in the composite pane 100, for example, one for each vehicle occupant.

In the example depicted, the structure and the fine-tuning of the sensor electronics system 14 are coordinated such that upon contact inner pane surface IV of the pane 1 via the contact region 11 of the capacitive switching region 10, a switching signal is triggered, whereas upon contact the outer surface I of the outer pane 4, no switching signal is triggered. This has the particular advantage that no switching signal can be triggered by intentional or accidental contacting of the composite pane 101 from outside the vehicle. Also, accidental triggering of a switching signal, for example, by rain or a carwash is avoided.

Moreover, in this example, the area of the contact region 11 and in particular its width $b_B$ is coordinated with the width $b_Z$ of the supply line region 12 such that only upon contacting the inner surface IV of the inner pane 1 via the contact regions 11 (i.e., in that region of the inner surface IV resulting from orthogonal projection of the contact region 11 onto the inner surface IV), a switching signal is emitted and not upon contact of the inner surface IV of the inner pane 1 via the supply line region 12.

FIG. 3A depicts another embodiment of the composite pane 101 using the example of a windshield in a view toward the inner surface IV of the inner pane 1, i.e., from the position of the vehicle occupants outward.

FIG. 3B depicts a cross-sectional view along the section line A-A' of FIG. 3A. The structure of the composite pane 101 of FIG. 3A corresponds, for example, to the structure of the composite pane 101 of FIG. 2A, wherein the dimensions of the composite pane 101 were merely configured for installation as a windshield. The capacitive switching region 10 was arranged, for better reachability by the vehicle driver, at the lower left edge outside the central field-of-view.

FIG. 4A depicts a flowchart of an exemplary embodiment of the method according to the invention for producing a pane arrangement 200 according to the invention with a window pane 100 with a capacitive switching region 10.

The method according to the invention comprises the following steps:

I. Applying a low-E coating (6) on an inner surface (IV) of a pane (1), II. Introducing at least one first partition line (7), which electrically divides the low-E coating (6) into at least one capacitive switching region (10) and at least one surrounding region (15), preferably by laser patterning or by mechanical or chemical ablation, III. Introducing at least one second partition line (8) into the low-E coating (6), which electrically divides the surrounding region (15) and an outer region of the low-E coating (6), preferably by laser patterning or by mechanical or chemical ablation.

FIG. 4B depicts a flowchart of an exemplary embodiment of the method according to the invention for producing a composite pane 101 with a capacitive switching region 10.

The method according to the invention comprises the following steps:

I. Applying a low-E coating (6) to an inner surface (IV) of a pane (1);

II. Introducing at least one first partition line (7), which electrically divides the low-E layer (6) into at least one capacitive switching region (10) and at least one surrounding region (15) of the low-E coating (6), preferably by laser patterning or by mechanical or chemical ablation;

III. Introducing at least one second partition line (8) into the low-E coating (6), which electrically divides the surrounding region (15) and an outer region of the low-E coating (6), preferably by laser patterning or by mechanical or chemical ablation, IV. Producing a stack sequence of the pane (1), an intermediate layer (2), and an outer pane (4), and V. Laminating the stack sequence to form a composite pane (100).

The pane arrangement according to the invention with a window pane 100 of FIG. 1 and the composite panes 102 of the FIGS. 2 and 3 have a capacitive switching region 10, which is, for example, connectable to a capacitive sensor electronics system 14. Moreover, as a result of the low width of the partition lines 7, the view through the window pane or the composite pane is only minimally impaired and meets, for example, the requirements for a motor vehicle glazing.

Particularly advantageously and surprisingly, a pane arrangement 200 with a window pane 100 or a pane arrangement 201 with a composite pane 101, in which the sensitivity of the sensor electronics system 14 is coordinated such that a selective triggering of the switching procedure is possible only from an inner surface IV of the window pane 100 or of the composite pane 101.

LIST OF REFERENCE CHARACTERS 1 pane, inner pane
2 intermediate layer
4 outer pane
6 low-E coating
7 first partition line
8 second partition line
10 capacitive switching region
11 contact region
12 supply line region
13 first connection region
14 capacitive sensor electronics system
15 surrounding region
16 second connection region
17 foil conductor
18 pane edge
19 round conductor, stranded conductor
20 electrical line connection
21 light-emitting diode (LED)
22 functional intermediate layer
30 coating-free region
31 outer region
32 coating edge
100 window pane
101 composite pane
200, 201 pane arrangement
A area of the contact region 11
$b_A$ width of the connection region 13
$b_B$ width of the contact region 11
$b_Z$ width of the supply line region 12
$d_1, d_2, d_4, d_6$ thickness
$\varepsilon_0$ electric field constant
$\varepsilon_{r,1}, \varepsilon_{r,2}, \varepsilon_{r,4}$ relative permittivity
u width of the surrounding region 15, distance of the partition line 7 of the surrounding region 15 from the partition line 7 of the capacitive switching region 10
$l_A$ length of the connection region 13
$l_B$ length of the contact region 11
$l_Z$ length of the supply line region 12
$t_1$ width of the partition line 7
A-A' section line
B-B' section line
Z detail
I outer surface of the outer pane 4
II inner surface of the outer pane 4
III outer surface of the pane 1 or of the inner pane 1
IV inner surface of the pane 1 or of the inner pane 1

The invention claimed is:

1. A pane arrangement, comprising:
a pane with an inner surface and an outer surface;
a low-E coating, which is arranged at least partially on the inner surface of the pane;
at least one coating-free first partition line, formed in the low-E coating so as to form at least one capacitive switching region which is electrically isolated from a surrounding region of the low-E coating, wherein the surrounding region at least partially surrounds the at least one capacitive switching region,
wherein the at least one capacitive switching region has a contact region, a supply line region, and a first connection region, and
wherein the supply line region electrically connects the contact region to the first connection region;
at least one coating-free second partition line, formed in the low-E coating, by which the surrounding region is electrically isolated from an outer region of the low-E coating, wherein the outer region at least partially surrounds the surrounding region; and
a capacitive sensor electronics system, which is electrically connected to the first connection region of the at least one capacitive switching region and to the surrounding region by means of a second connection region.

2. The pane arrangement according to claim 1, wherein the surrounding region completely surrounds the at least one capacitive switching region.

3. The pane arrangement according to claim 1, wherein the outer region completely surrounds the surrounding region.

4. The pane arrangement according to claim 1, wherein a shortest distance between the first partition line and the second partition line is in the range from 0.1 mm to 200 cm.

5. The pane arrangement according to claim 4, wherein the shortest distance between the first partition line and the second partition line is in the range from 0.5 mm to 100 mm.

6. The pane arrangement according to claim 5, wherein the shortest distance between the first partition line and the second partition line is in the range from 1 mm to 11 mm.

7. The pane arrangement according to claim 1, wherein a shortest distance between the first partition line and the second partition line is unchanged in a section of the second partition line surrounding the contact region and/or the supply line region and/or the connection region.

8. The pane arrangement according to claim 1, wherein the second partition line surrounds the at least one capacitive switching region like a frame.

9. The pane arrangement according to claim 1,
wherein a length of the supply line region is in the range from 1 cm to 70 cm, and
wherein a width of the supply line region to be measured perpendicular to the length is in the range from 0.5 mm to 10 mm.

10. The pane arrangement according to claim 9,
wherein the length of the supply line region is in the range from 1 cm to 12 cm, and
wherein the width of the supply line region to be measured perpendicular to the length is in the range from 0.5 mm to 2 mm.

11. The pane arrangement according to claim 1, wherein the contact region has a length in the range from 1 cm to 14 cm, and wherein a maximum width of the contact region measured perpendicular to the length is in the range from 1 cm to 14 cm.

12. The pane arrangement according to claim 11, wherein a ratio of the width of the supply line region to the maximum width of the contact region is at least 1:2.

13. The pane arrangement according to claim 1, wherein the supply line region is rectangular, strip-shaped, or line-shaped.

14. The pane arrangement according to claim 1, wherein the contact region is circular, elliptical, or drop-shaped.

15. The pane arrangement according to claim 1, wherein the contact region has an angled shape, with rounded corners, wherein the corners have a radius of curvature of at least 3 mm.

16. The pane arrangement according to claim 1, wherein the contact region has an area in the range from 1 $cm^2$ to 200 $cm^2$.

17. The pane arrangement according to claim 1, wherein a width of the first partition line and/or a width of the second partition line is in the range from 30 μm to 200 μm.

18. The pane arrangement according to claim 1,
wherein the pane is an inner pane of a composite pane, and
wherein the composite pane furthermore comprises an outer pane with an outer surface and an inner surface and at least one intermediate layer, which bonds the inner surface of the outer pane laminarily to the outer surface of the inner pane.

19. The pane arrangement according to claim 18, wherein a sensitivity of the capacitive sensor electronics system is selected such that
upon a contact of the contact region on the inner surface of the inner pane and/or the outer surface of the outer pane with a human finger, the capacitive sensor electronics system emits a first switching signal, and
upon contact of the supply line region on the inner surface of the inner pane and/or the outer surface of the outer pane, the capacitive sensor electronics system emits no switching signal or a second switching signal different from the first switching signal.

20. A method for producing a pane arrangement, comprising:
applying a low-E coating to an inner surface of a pane;
introducing at least one first partition line into the low-E coating, which electrically divides the low-E coating into at least one capacitive switching region and at least one surrounding region; and
introducing at least one second partition line into the low-E coating, which electrically divides the at least one surrounding region and an outer region of the low-E coating.

* * * * *